United States Patent [19]

Mau et al.

[11] Patent Number: 5,610,944
[45] Date of Patent: Mar. 11, 1997

[54] PROCESS AND DEVICE FOR SEGMENTATION INTO SUB-BANDS AND FOR RECONSTRUCTION OF A DIGITAL SIGNAL, AND CORRESPONDING DEVICE

[75] Inventors: Joël Mau; Patrice Soyer, both of Rennes, France

[73] Assignees: France Telecom; Telediffusion De France, both of Paris, France

[21] Appl. No.: 143,369

[22] Filed: Oct. 29, 1993

[30] Foreign Application Priority Data

Oct. 29, 1992 [FR] France ................................. 92 12930

[51] Int. Cl.$^6$ ................................................. H04K 1/10
[52] U.S. Cl. ..................... 375/260; 375/265; 375/296; 375/340; 375/341; 375/349; 375/350; 370/484; 348/388; 348/403
[58] Field of Search .......................... 375/99, 102, 103, 375/122, 240, 260, 296, 346, 349, 350, 377, 265, 340, 341; 348/384, 397, 398, 388, 403; 358/426, 428; 364/724.01, 724.2; 381/29, 30, 36, 41; 382/56; 370/23, 49.5, 69.1, 123, 70–72

[56] References Cited

U.S. PATENT DOCUMENTS

| | | | |
|---|---|---|---|
| 4,048,443 | 9/1977 | Crochiere et al. | 179/1 SA |
| 4,799,179 | 1/1989 | Masson et al. | 364/724.1 |
| 5,029,217 | 7/1991 | Chabries et al. | 381/68.2 |
| 5,097,331 | 3/1992 | Chen et al. | 358/138 |
| 5,182,645 | 1/1993 | Breeuwer et al. | 358/141 |
| 5,323,391 | 6/1994 | Harrison | 370/70 |

OTHER PUBLICATIONS

Crochiere et al, "Multiple Digital Signal Processing", pp. 303–323, Prentice Hall, 1983.

IEEE Transactions on Signal Processing, vol. 40, No. 4, Apr. 1992, "Cosine–Modulated FIR Filter Banks Satisfying Perfect Reconstruction" by Koilpillai et al, pp. 770–782.

IEEE International Symposium on Circuits and Systems, Harris et al, "Modified Polyphase Filter Structure for Computing Interpolated Data as Successive Differential Corrections", Jun. 1991, pp. 2753–2756.

*Primary Examiner*—Stephen Chin
*Assistant Examiner*—Amanda T. Le
*Attorney, Agent, or Firm*—Larson & Taylor

[57] ABSTRACT

A process and device for segmentation into and reconstruction from sub-bands of a digital signal each sample of which are submitted to a parallel processing on a plurality of paths by prototype filtering modulated by a periodic function and sub-sampling by the number of sub-bands. A combination of a filtering of modified polyphase type and of a processing by frequency transform is therefor performed so as to deliver a sub-band signal for each path of corresponding rank. Reconstruction comprises in combination the dual steps of frequency transform and modified polyphase filtering so as to deliver a reconstructed digital signal. Corresponding modules for frequency transform and modified polyphase filtering are embodied through MOT or PRMF filters.

27 Claims, 21 Drawing Sheets

PROCESS AND DEVICE FOR SEGMENTATION INTO SUB-BANDS AND FOR RECONSTRUCTION OF A DIGITAL SIGNAL, AND CORRESPONDING DEVICE

BACKGROUND OF THE INVENTION

1. Field of the Invention

The invention relates to a process and a device for segmentation into sub-bands and for reconstruction of a digital signal.

2. The Prior Art

Presently, there are several techniques for the splitting or for the transformation of digital signals, from the time domain into the frequency domain, and for the corresponding associated inverse transformation. Among those best known may be cited the discrete cosine transform, or DCT, the fast Fourier transform, FFT, or the Karhunen-Loeve transformation. Furthermore, certain techniques are more specific to splitting into sub-bands and to the corresponding reconstruction, these techniques being more especially based on the use of conjugate quadrature filters or CQF, quadrature mirror filters, QMF and pseudo quadrature mirror filters or PQMF.

Generally, these techniques for transformation and reconstruction are used for example for the purpose of performing a throughput reduction coding of digital signals, made possible by concentrating the useful information over a reduced number of mutually uncorrelated coefficients, which are then transmitted alone.

These techniques can be and are used for the transmission of digital audio or video signals for example.

However, the above techniques other than the processes for segmentation into sub-bands, applied to the transmission of digital video signals, have the disadvantage of applying one set of coefficients to a block of pixels, taking no account of the adjacent blocks. The effect of such a lapse, during the procedure for reconstructing the original signal after transmission, is to generate block effect phenomena which are all the more visible the lower the number of useful coefficients arising from the transformation.

By way of illustration may be cited, as represented in FIG. 1a, the example of a DCT transform applied to a digital signal, linearly dependent on the rank of each block, for which only the continuous coefficient (or component) is preserved in the frequency domain, following the transform carried out. The signal generated after reconstruction then takes the form of a staircase function, the length of whose plateau or step is equal to the dimension of the DCT transform used. Such a function reveals, in particular, the effects of blocks inherent in the use, for the implementation of this type of transform, of weighting or filtering windows of type logical AND [1,0] over the length of each block, as represented in FIG. 1b.

Elimination of the aforesaid block effect has been made possible by implementing the processes for sub-band splitting/reconstruction using filtering windows with softer profile and of greater length than the length of the blocks, and such as represented in FIG. 1c, and thereby deriving more from the correlations between neighboring blocks.

As regards the sub-band filtering processes implemented using cascaded structures based on CQF or QMF filters, the obtaining of a near-perfect reconstruction and the involvement of a consequent number of sub-bands have led to the use of relatively long filters requiring prohibitive computation times.

In the case, on the contrary, of transformations implementing banks of PQMF filters generating sub-bands in parallel, although the necessary computational costs are not as large, the length of the filters is by contrast large, at least equal to eight times the number of segmentation sub-bands, whereupon, employing certain approximations however, almost perfect conditions for reconstruction of the original signal are sought. The use of PQMF filters with 64 coefficients is thus common for the splitting and then reconstructing of a digital signal as eight sub-bands, the filters used for this type of transformation most often consisting of an even number of coefficients, even multiples of the number of sub-bands SB.

Generally, as represented in FIG. 1d, a device for segmentation into sub-bands of conventional type comprises a plurality SB of parallel paths each receiving the samples E(n) of the digital input signal. Each of the paths corresponds to a sub-band and includes a digital sub-band filter, denoted 100-1, for the path or the sub-band of corresponding rank k. This digital filter is formed for example by a prototype filter of low-pass type, modulated by a periodic function. It will however be noted that the prototype filter of low-pass type with transfer function h(n) can be replaced by a high-pass filter with transfer function $(-1)^n \cdot h(n)$. It is followed by a sub-sampler circuit, denoted 100-2, this circuit performing a sub-sampling by the number SB of sub-bands or of paths so as to deliver a sub-band signal $X_k$ for each path of corresponding rank k.

It is of course understood that each path thus includes a digital filter followed by a sub-sampler circuit in order to deliver a sub-band signal of corresponding rank k.

Similarly, as likewise represented in FIG. 1d, a device for reconstructing a digital sub-band signal of conventional type, this signal corresponding to a plurality SB of sub-band signals $X_k$ delivered in parallel following an earlier segmentation into sub-bands of a digital input signal E(n), comprises a plurality SB of parallel processing paths, each parallel path, for a relevant sub-band signal $X_k$, including a circuit for sub-sampling by the number SB of sub-band signals, this circuit being followed by a digital sub-band filtering circuit. This circuit is formed of a prototype filter of low-pass type modulated by a periodic function in order to deliver a sub-band component, denoted $R_k$, of the reconstructed digital signal, obtained by summing the components.

SUMMARY OF THE INVENTION

The object of the present invention is to remedy the above disadvantages of the prior techniques.

Another subject of the present invention is accordingly the implementation of a process and a device for segmentation into sub-bands and for reconstruction of a digital signal allowing perfect or almost perfect reconstruction through the use of PRMF (Perfect Reconstruction Modulated Filter) or CPRMF (Close to Perfect Reconstruction Modulated Filter) filter banks, these filters possibly having a very short length, even or odd.

Another subject of the present invention is also the implementation of a process and a device for segmentation into sub-bands and for reconstruction of a digital signal, constituting a noticeable improvement to the prior art techniques based on the use of PQMF modulated filters, insofar as, through the aforesaid implementation, shorter filters make it possible to perform a segmentation into a same number of sub-bands and a perfect reconstruction of the digital signal.

Another subject of the present invention is also the implementation of a process and a device for segmentation into sub-bands and for reconstruction which are based on a fast processing procedure for each segmentation respectively reconstruction operation, this processing procedure, of regular structure, enabling the number of operations required to be minimized.

Another subject of the present invention is furthermore, by virtue in particular of the properties of the aforesaid processing procedure, the implementation of corresponding processing modules in integrated circuit form, requiring a minimum memory size.

Another subject of the present invention is also the implementation of a device for the segmentation into sub-bands and for reconstruction of a digital signal having, thereby, a modular structure, possibly, as appropriate, calling upon the use of certain elements or modules already available on the market.

The process for sub-band segmentation of a digital signal consisting of a sequence of digital samples, which is the subject of the present invention, a process of the type consisting in submitting each sample to a parallel processing on a plurality of paths so as to split up this digital signal into a corresponding number of sub-bands, this processing, for each sub-band, consisting in performing a prototype filtering modulated by a periodic function and a sub-sampling by the number of sub-bands, in order to deliver a sub-band signal $X_k$ for each path of corresponding rank k, is notable in that it consists, for a string of sample blocks formed by N samples forming the digital signal, in performing, by means of a prototype filtering of low-pass type with two components, a symmetric component and an antisymmetric component, each modulated by a periodic function, in combination, a filtering and a processing by frequency transform of the digital signal, this filtering corresponding to a modified polyphase filtering, thus making it possible to deliver a sub-band signal $X_k$ for each path of corresponding rank k.

The process for reconstruction of a digital sub-band signal, which is the subject of the present invention, this signal corresponding to a plurality of sub-band signals $X_k$ delivered in parallel following a segmentation into sub-bands of a digital signal E(n), this reconstruction process being of the type consisting in submitting each sub-band signal $X_k$ to a parallel processing including an oversampling by the number of sub-band signals and a digital filtering by means of a prototype filtering of low-pass type modulated by a periodic function in order to deliver a reconstructed digital signal sub-band component $R_k$, then a synchronous summation of the reconstructed digital signal sub-band components to generate the reconstructed digital signal Rec(n), is notable in that it consists, for a plurality of sub-band signals $X_k$, in performing, by means of a prototype filtering of low-pass type with two components, a symmetric component and an antisymmetric component, each modulated by a periodic function, in combination, a processing by frequency transform of sub-band signals and a filtering, this filtering processing corresponding to a filtering processing of modified polyphase type, thus making it possible to deliver the reconstructed digital signal.

The device for sub-band segmentation of a digital signal, this digital signal consisting of a sequence of samples which the subject of the present invention, comprising a plurality SB of parallel paths each receiving said samples E(n). It is notable in that, for a string of sample blocks formed of SB samples, it comprises, in cascade, a stage for prefiltering the digital input signal, this prefiltering corresponding to a modified polyphase filtering applied to each sample block, to deliver components of prefiltered signals, and a stage for processing by inverse frequency transform of dimension SB of the components of prefiltered signals, enabling the sub-band signals $X_k$ to be delivered.

The device for reconstruction of a digital subband signal, this signal corresponding to a plurality SB of sub-band signals $X_k$, K∈ [0,SB−1] delivered in parallel on a plurality SB of parallel paths following a segmentation into sub-bands of a digital signal sample sequence E(n), is notable in that it comprises in cascade a stage for processing the sub-band signals by direct frequency transform and a postfiltering stage, this postfiltering corresponding to a modified polyphase filtering, enabling the reconstructed digital signal to be delivered.

The process and the device for segmentation into sub-bands respectively for reconstruction of a digital signal, which are the subjects of the invention, find application to the processing of digital audio or video digital signals for example, in particular to the processing of a two-dimensional image, separable or non-separable, and to the construction of corresponding processing modules in the form of integrated circuits.

BRIEF DESCRIPTION OF THE DRAWINGS

The object of the invention and in particular the equivalent nature, from the functional processing view-point at least, between the carrying out, in combination, of a prefiltering and a frequency transform processing of the digital signal or of a frequency transform processing and postfiltering and the carrying out of a digital sub-band filtering and sub-sampling in the case of segmentation, on the one hand, and, on the other hand, the carrying out in combination of a frequency transform processing and postfiltering or a prefiltering and frequency transform processing, and the carrying out of an oversampling and digital sub-band filtering in the case of reconstruction, will be better understood on reading the description and on looking at the drawings below in which, apart from FIGS. 1a) to 1d) relating to the prior art.

DESCRIPTION OF THE PREFERRED EMBODIMENTS

The process for, respectively, segmentation into sub-bands, and for reconstruction of, a digital signal, which is the subject of the present invention, will now be described in connection with FIGS. 2a, 2b and 2c.

Figure 1A:
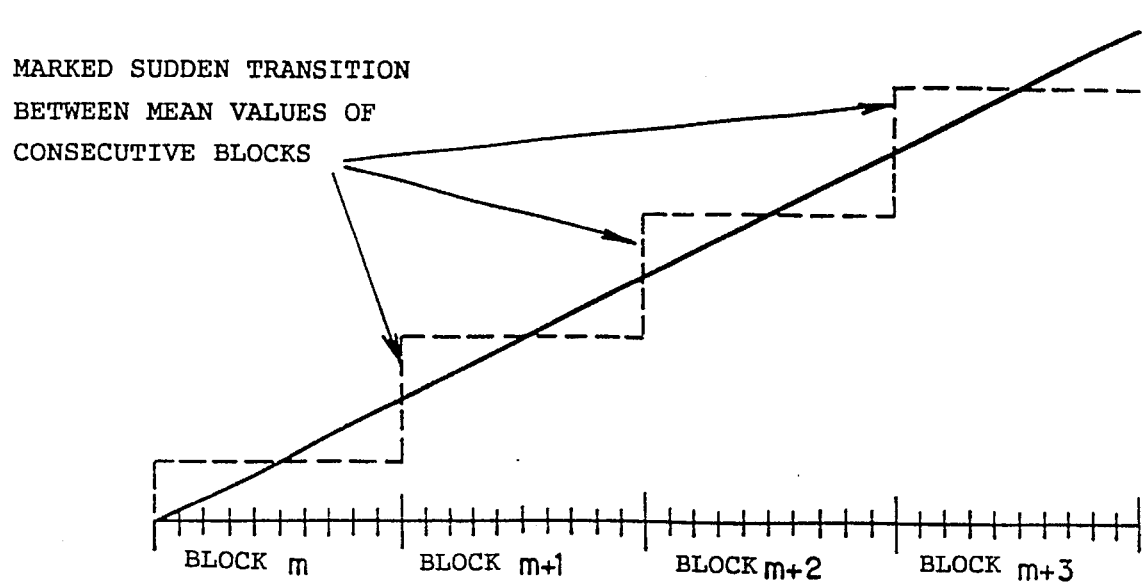
Figure 1B:
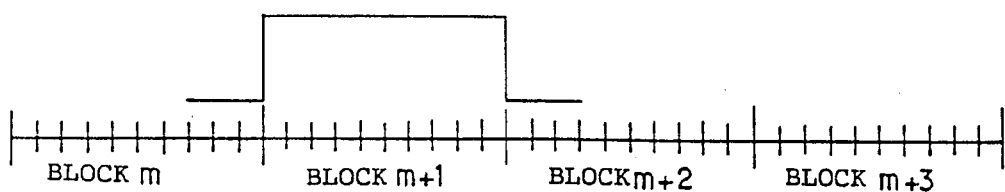
Figure 1C:
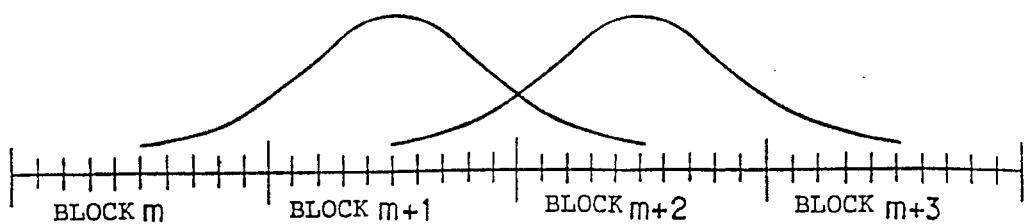
Figure 1D:
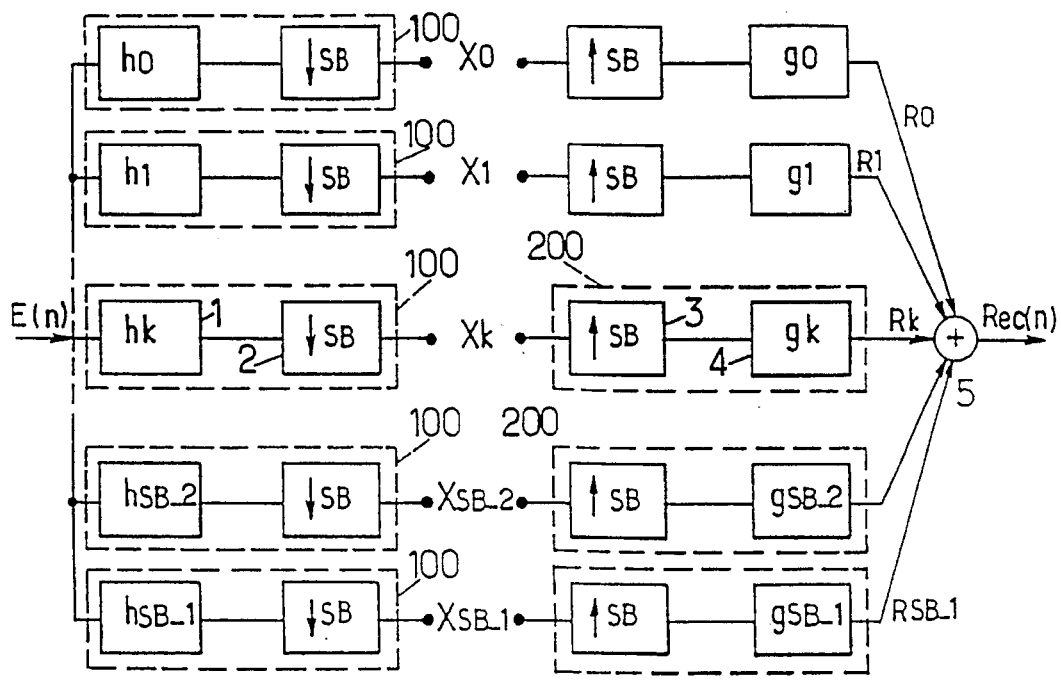
Figure 2A:
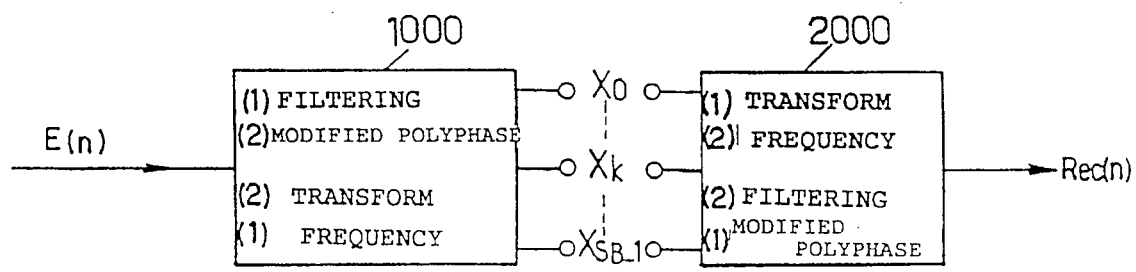
FIG. 2a represents, in the form of a purely illustrative block diagram, the steps for implementing the process which is the subject of the invention relating to the segmentation and reconstruction of the digital signal.

According to the aforesaid FIG. 2a, the digital signal submitted to the sub-band segmentation processing consists of a sequence of digital samples denoted E(n) where n designates the order of a relevant current sample.

As will be observed on looking at FIG. 2a, the process consists in submitting each sample to a processing relating both to the procedure for segmentation into sub-bands proper and to the procedure for reconstruction from the corresponding sub-bands, as will be described in more detail later in the description.

In accordance with the process which is the subject of the invention, the processing enabling the segmentation procedure to be carried out consists, according to a notable aspect of the process which is the subject of the present invention, for a string of sample blocks formed by SB samples and constituting the digital input signal, in performing, by means of a prototype filtering of low-pass type with two components, a symmetric component and an antisymmetric component, each modulated by a periodic function, as represented in FIG. 2a, in combination, a filtering and a processing by frequency transform of the digital input signal. The filtering corresponds to a modified polyphase filtering, thus making it possible to deliver a sub-band signal $X_k$ for each path of corresponding rank k.

The periodic function modulating the symmetric component and the antisymmetric component depends on the rank of each sub-band, on the number of sub-bands and on the number of coefficients of the filter bank used.

Represented in FIG. 2a is the corresponding processing 1000 performed for the aforesaid components of rank k, this processing consisting in performing in combination either a modified polyphase filtering and a frequency transform, or on the contrary a frequency transform and a modified polyphase filtering under conditions which will be explained later. The corresponding combination of the modified polyphase filtering and frequency transform, or vice versa, at step 1000 of the segmentation-procedure according to the subject of the present invention, is represented by carrying out steps (1) then (2) in succession, corresponding respectively either to the modified polyphase filtering step followed by the frequency transform, or to the frequency transform step followed by the modified polyphase filtering step.

Figure 2B:
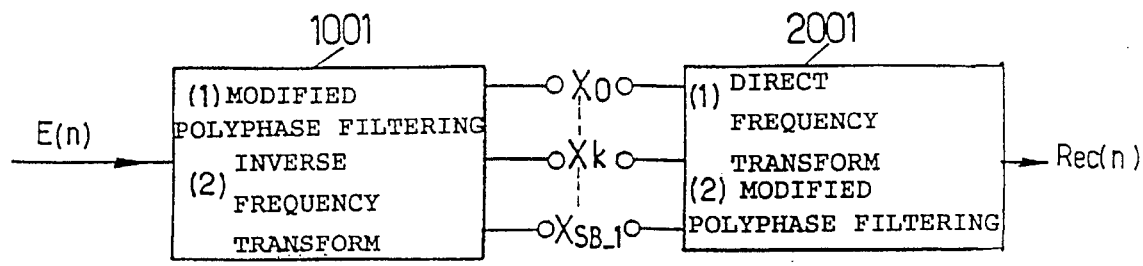
FIG. 2b and FIG. 2c represent a first respectively second mode of implementing the process which is the subject of the invention in the case of segmentation respectively that of reconstruction.

Thus, as has therefore been represented in FIG. 2b, step 1000, for the corresponding sub-band components of rank k, can thus consist in prefiltering the digital input signal, this prefiltering corresponding to the modified polyphase filtering applied to each sample block to obtain a corresponding prefiltered signal, in step (1) of step 1001 of FIG. 2b, this step (1) being followed by the step (2) of inverse frequency transform of the prefiltered signal, so as to deliver the corresponding sub-band signal $X_k$.

Figure 2C:
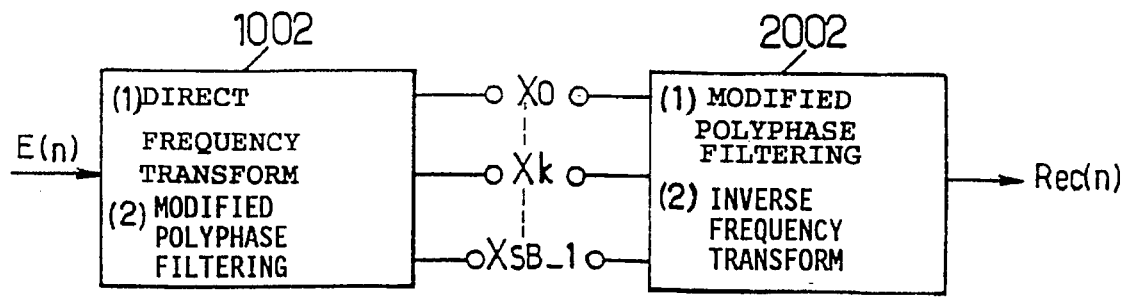

Similarly, but in a dual manner, the process which is the subject of the present invention can consist, as represented in FIG. 2c, in performing a direct frequency transformprocessing in step (1) of the segmentation procedure 1002 represented in FIG. 2c, to obtain a transformed signal, this step (1) of direct frequency transform processing being followed by a postfiltering (2) of the transformed signal, this postfiltering corresponding to a modified polyphase filtering to deliver the sub-band signal $X_k$ for each path of corresponding rank k.

Furthermore, as represented in FIG. 2a, the process which is the subject of the present invention relates to a process for reconstruction of a digital sub-band signal, this signal corresponding to a plurality of sub-band signals $X_k$. It will be noted that these sub-band signals are delivered in parallel following a segmentation into sub-bands of a digital input signal E(n), the aforesaid segmentation having been performed for example in accordance with the segmentation process described previously with FIGS. 2a to 2c.

The reconstruction process which is the subject of the present invention consists according to a particularly advantageous aspect, for a plurality of sub-band signals $X_k$, in performing, by means of a prototype filtering of low-pass type with two components, a symmetric component and an antisymmetric component, each modulated by a periodic function, in combination, a filtering and a frequency transform processing of the aforesaid sub-band signals. This filtering processing corresponds to a filtering processing of modified polyphase type, thus making it possible to deliver the reconstructed digital signal Rec(n).

The periodic function modulating the symmetric component and the antisymmetric component depends on the rank of each sub-band, on the number of sub-bands and on the number of coefficients of the filter bank used.

In a manner similar to the segmentation process which is the subject of the present invention, the reconstruction process represented in FIG. 2a by a step 2000, for the paths of rank k, in which step 2000 may be performed, either a frequency transform and a modified polyphase filtering, or a modified polyphase filtering and a frequency transform, as will be described in the description in more detail.

As represented in FIG. 2b, the reconstruction process which is the subject of the present invention consists for example in performing, in a step 2001, for the paths of rank k, a direct frequency transform processing to deliver from each digital sub-band signal a plurality of transformed digital signals and postfiltering processing of modified polyphase type of the transformed digital signals to deliver postfiltered transformed digital signals, thus making it possible to deliver the reconstructed digital signal Rec(n). The direct frequency transform, respectively modified polyphase filtering, steps are denoted (1), respectively (2), in step 2001 mentioned previously.

Similarly, and in a manner analogous to the segmentation procedure described previously, in connection with FIG. 2c, the reconstruction process which is the subject of the present invention can consist in performing, for the paths of rank k, a prefiltering processing (1) of modified polyphase type of the digital sub-band signals, $X_k$, to deliver a plurality of prefiltered sub-band digital signals, and an inverse frequency transform processing of the prefiltered sub-band digital signals, this frequency transform operation being denoted (2) in FIG. 2c, the entire reconstruction procedure for the paths of rank k being denoted 2002 in FIG. 2c, thus making it possible to deliver the reconstructed digital signal Rec(n).

It will be noted that the process for segmentation into sub-bands, respectively for reconstruction of a digital signal, which is the subject of the present invention, can be applied to any type of digital input signal, digital audio or video signal, in particular to two-dimensional video signals, which can be submitted to a processing of separable type for example, to obtain a specified number SBx.SBy of sub-bands. However, the process which is the subject of the present invention can be applied to the general case of separable or non-separable two-dimensional video signals.

It will be noted furthermore that the process which is the subject of the present invention is not limited to a particular type of digital signal. In particular, the segmentation respectively reconstruction procedure can be reapplied in cascade on one or more of the outputs respectively inputs of each segmentation respectively reconstruction path as will be described later in connection with FIGS. 3a and 3b.

Figure 3A:
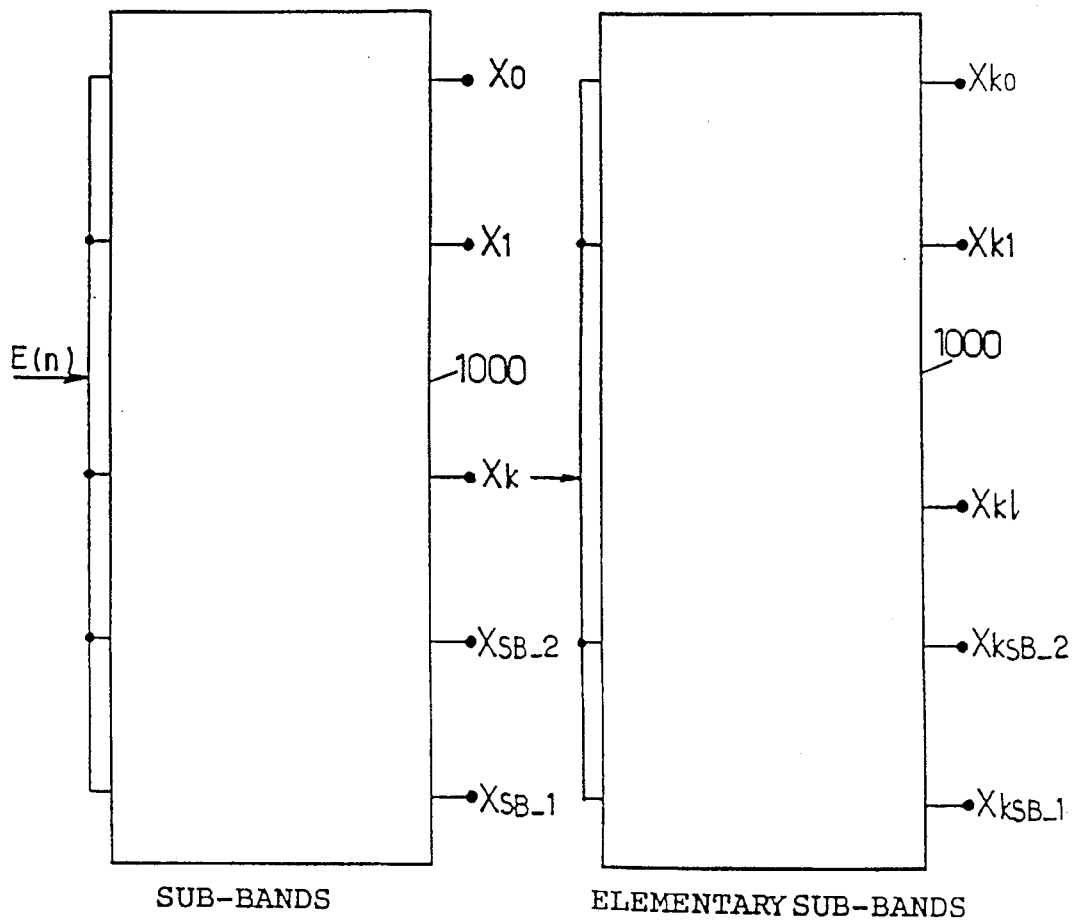
FIG. 3a represents an advantageous variant implementation of the process which is the subject of the present invention in a successive manner to at least one sub-band signal, in the case of segmentation, in order to obtain elementary sub-bands.

As represented in FIG. 3a, the segmentation process which is the subject of the present invention can thus consist in submitting one at least of the sub-band signals $X_k$ delivered to the previously described processing on a plurality of paths or of elementary sub-bands so as to split this sub-band signal $X_k$ into elementary sub-band signals denoted $X_{k1}$. It is of course understood that any sub-band signal can be thus split into a number SBE of elementary sub-bands. The aforesaid processing can then be reapplied to at least one of the elementary sub-bands to generate elementary sub-bands of corresponding higher successive rank. This iteration of the process and of the parallel processing corresponding thereto, in accordance with the subject of the present invention, thus makes it possible to perform a sophisticated splitting of the original digital signal, into sub-bands and/or into elementary sub-bands, so as to concentrate the energy of the initial signal into certain sub-bands or elementary sub-bands of higher successive rank, thus making it possible, as appropriate, to envisage specific processings on each sub-band, depending for example on the conditions of transmission. In FIG. 3a, step 1000 delivering the sub-band signals is then reapplied to a sub-band signal $X_k$ for example to deliver the elementary sub-band signals $X_{k1}$, as represented in the aforesaid figure. In a general way, it will be understood that the number of elementary sub-bands can for example be taken equal to the number of sub-bands with SBE=SB.

Figure 3B:
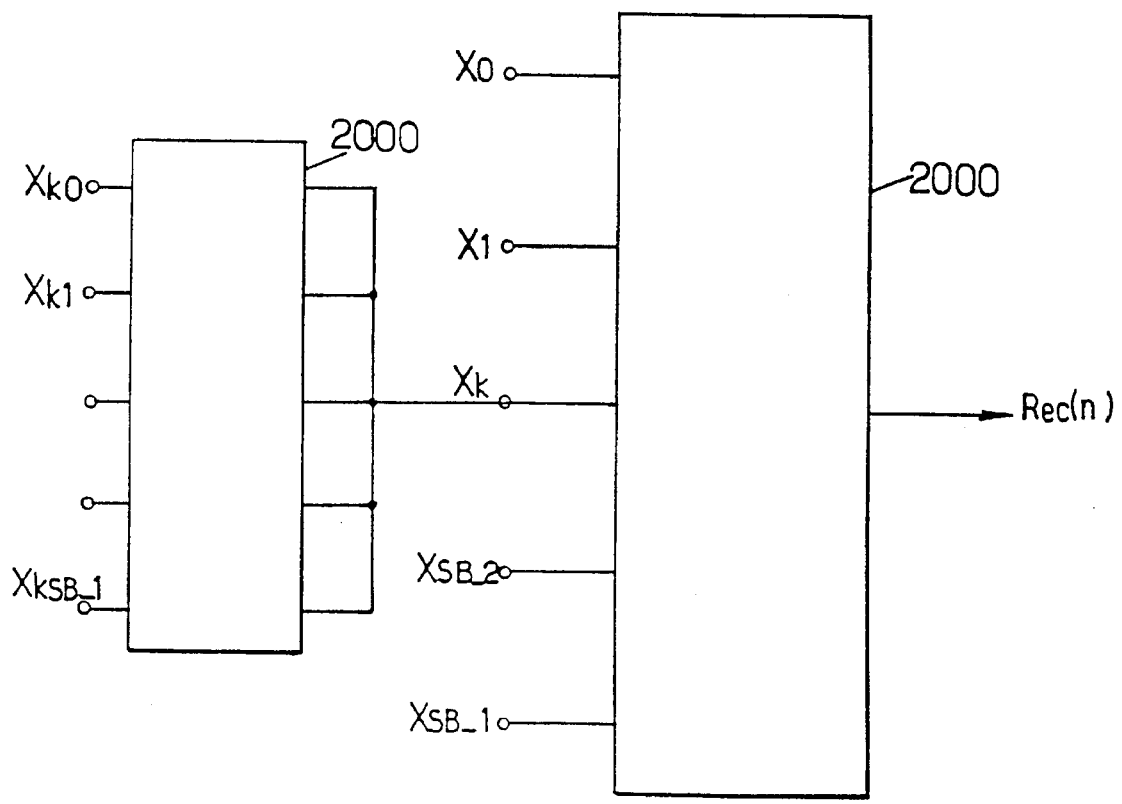
FIG. 3b represents, in a similar but dual manner to that of FIG. 3a, an advantageous variant implementation of the process which is the subject of the invention in a successive manner to at least one collection of elementary sub-bands in order to reconstruct a corresponding sub-band signal, in the case of the reconstruction of the digital signal.

Similarly, the process for reconstruction of a digital signal, according to the subject of the present invention, can be applied to elementary sub-band digital signals, as represented in FIG. 3b, the elementary sub-band signals, $X_{k0}$ to $X_{kSB-1}$, being submitted to a procedure for reconstruction by means of a processing procedure denoted 2000, as represented in FIG. 2a, the elementary sub-band signal of rank p, p=1 in the case of FIG. 3b, being submitted to the reconstruction process in accordance with the subject of the present invention in order to generate, by reconstruction, an elementary sub-band signal of lower rank in succession and then the corresponding sub-band signal $X_k$.

It is of course understood that the reconstruction procedure, as represented in FIG. 3b, can advantageously be implemented when a digital input signal has been split into sub-bands, respectively into elementary sub-bands, in accordance with the process which is the subject of the present invention as represented in FIG. 3a.

A more detailed description of the device for segmentation into sub-bands respectively for reconstruction of a digital signal according to the subject of the invention will now be given in connection with FIGS. 4 and 5 et seq.

Figure 4:
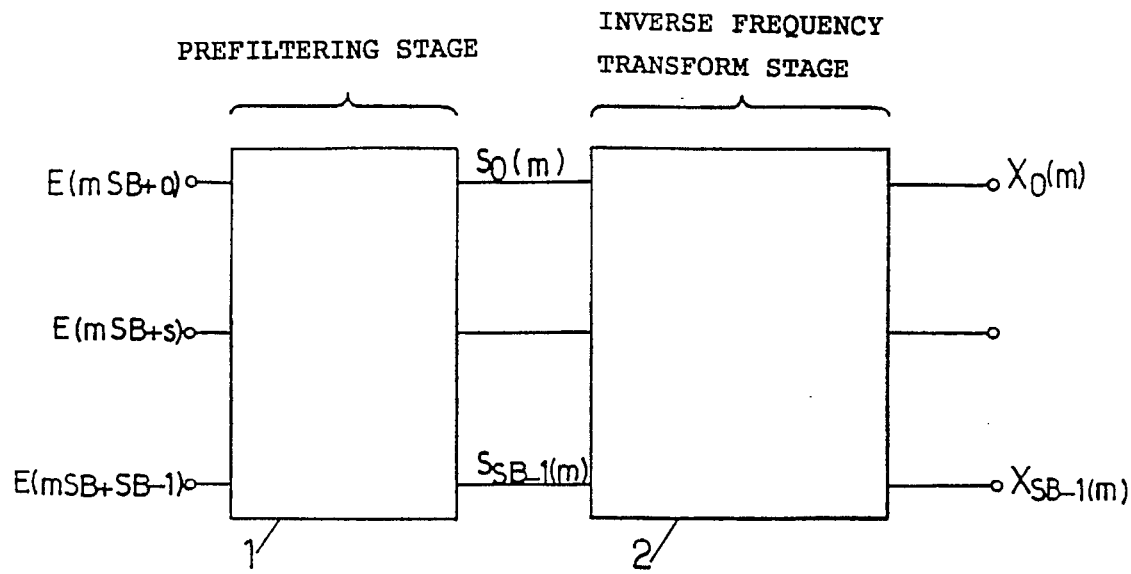
FIGS. 4 and 5 represent, in overview, a particular embodiment of a device according to the invention, a device for segmentation, and for reconstruction, respectively

According to FIG. 4, the segmentation device which is the subject of the invention comprises a prefiltering stage 1 for the digital input signals, denoting E(m.SB+s), s∈ [0,SB−1]

and m denoting the number of the current block of size SB. The prefiltering stage 1 is followed by an inverse frequency transform stage 2. It is noted that the prefiltering stage delivers components of prefiltered signals $S_0(m)$ to $S_{SB-1}(m)$ to the frequency transform stage 2, which delivers the sub-band signal components $X_0(m)$ to $X_{SB-1}(m)$.

In a dual manner, the segmentation device which is the subject of the present invention can, as described previously in relation to the process according to the invention, include a direct frequency transform stage receiving the samples E(mSB+s) and delivering frequency transform signals to a postfiltering stage, which delivers the sub-band signal components $X_0(m)$ to $X_{SB-1}(m)$. In both cases, the pre- respectively postfiltering stage makes it possible to carry out modified polyphase filtering.

Figure 5:
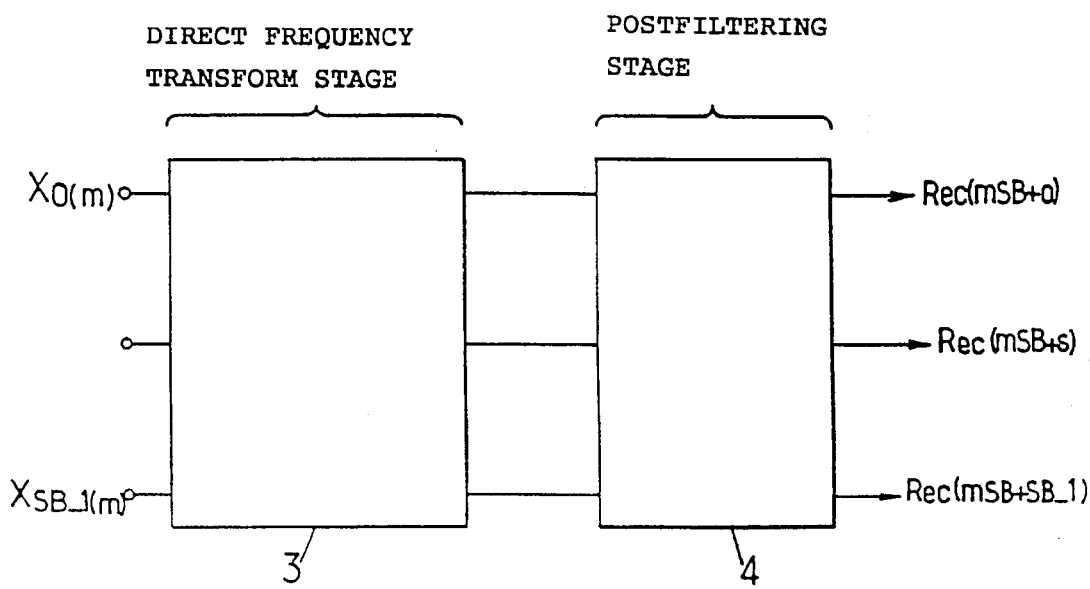

Similarly, as represented in FIG. 5, the device for reconstruction of the sub-band digital signal components $X_0(m)$ to $X_{SB-1}(m)$ comprises a direct frequency transform stage 3 delivering frequency transform signals and a postfiltering stage 4 delivering on the basis of these signals the reconstructed signal Rec(m.SB+s). In a dual manner, the reconstruction device which is the subject of the present invention can also include a prefiltering stage followed by an inverse frequency transform stage as described previously in the description relating to the process, the post- respectively prefiltering stage enabling a modified polyphase filtering to be carried out.

It will be noted, as regards the device for segmentation, respectively reconstruction of a digital sub-band signal which is the subject of the present invention, that it makes possible, after sub-band segmentation, perfect reconstruction of the digital input signal, or digital source signal, it being possible advantageously for the filters used to be PRMF type modulated filters or filter banks, both for the segmentation phase which, for convenience for example, will be called the direct processing procedure, and for the reconstruction phase which will be called the inverse processing procedure.

It will be noted in particular that the device which is the subject of the present invention allows a separable approach to the processing of video image signals in order to split a two-dimensional signal into SBx.SBy sub-bands. However, the novel techniques developed in this particular case can also be extended immediately to the general case, separable or not. Furthermore, the type of processing, direct or inverse, mentioned previously can be reapplied in cascade on one or more outputs, that is to say one or more sub-bands, on respectively one or more inputs, to reconstruct the original signal, as described previously in connection with FIGS. 3a and 3b.

It will be noted in particular, according to a particularly advantageous aspect of the device which is the subject of the present invention, that the filter bank used can be a filter bank with perfect or almost perfect reconstruction, of CPRMF type, having an odd number, NF, of coefficients. This type of filter then allows a splitting into SB sub-bands, using the associated modulated filter bank, as will be described subsequently in the description.

A more detailed description of the embodiment of modulated filter banks for analysis, that is to say for segmentation, and for synthesis, that is to say for reconstruction, using the same prototype filter h(n) for implementing the process and the device which are the subjects of the present invention will now be given in connection with FIGS. 6a to 6e.

In a general way, it is pointed out that the filter banks used can consist of MOT (Modulated Orthogonal Transforms) filters for M Sub-band Modulated Orthogonal Regular Transforms, or of PRMF filter banks. The family of MOT filters covers not only all PRMF filter banks, it being possible to choose the number NF of coefficients and the number SB of sub-bands arbitrarily, but also all the orthogonal transforms or CQF (Conjugate Quadrature Filters) for splitting into two sub-bands.

The generic expression for the transfer function h(n) of the prototype filter is then of the form:

$$h(n) = \tfrac{1}{2}[hs(n) + ha(n)],$$

where hs(n) and ha(n) represent respectively the symmetric and antisymmetric components of h(n), with $$hs(n) = h(n) + h(NF-1-n)$$

$$ha(n) = h(n) - h(NF-1-n).$$

The filters for analysis or segmentation, respectively for synthesis or reconstruction are then obtained after summing the terms resulting from different modulations applied separately to each of the symmetric and antisymmetric components of the prototype filter, and their transfer functions are expressed by the following general relations:

$$hk(n) = \tfrac{1}{2}[hs(n) \cdot Ck(n) - ha(n) \cdot Ck(NF-1-n)]$$

for the analysis filters, and respectively $$gk(n) = \tfrac{1}{2}[hs(n) \cdot Ck(NF-1-n) + ha(n) \cdot Ck(n)] = hk(NF-1-n)$$

for the synthesis filters.

In the above relations, it is noted that k denotes the rank of the relevant sub-band, and the formulae for the modulation functions are by definition:

$$Ck(n) = 2 \cdot \cos\left[\frac{\pi \cdot (2k+1) \cdot (2n - NF + 1 - SB)}{4 SB}\right]$$

$$Ck(NF-1-n) = 2 \cdot \cos\left[\frac{\pi \cdot (2k+1) \cdot (2n - NF + 1 + SB)}{4 SB}\right]$$

NF denoting the number of coefficients of the filter bank used and SB the number of sub-bands, n denoting the current index.

A particular interesting case of the family of MOT filters is that for which the antisymmetric component is taken to be zero, ha(n)=0. In this case the filters satisfying the aforesaid condition are none other than the PRMF filters mentioned earlier in the description.

In the general theory of MOT filter banks, the symmetric hs(n) and antisymmetric ha(n) components of the low-pass prototype filter must satisfy the conditions for perfect reconstruction. However, when implementing MOT filters, the removal of several restrictions, by comparison with the case of the implementation of PRMF filters, makes it possible to obtain a greater freedom of choice of the parameters of the filters than when implementing PRMF filters. Furthermore, the implementation of short length MOT filters with a number of coefficients NF≦2.SB, perfectly adapted to the reduction of throughput in image coding, also permits effective production as an integrated circuit based on processing with a fast algorithm, by means of a structure similar to that described below in the context of PRMF filters.

Figure 6A:
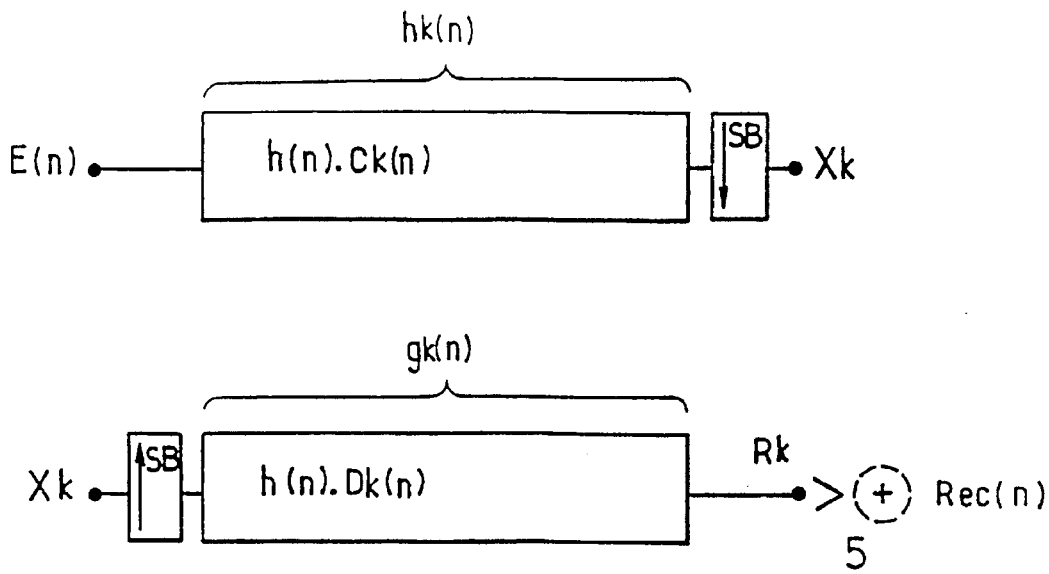
FIG. 6a represents, diagrammatically, an embodiment of the transfer functions of the modulated filter banks of the segmentation and reconstruction, respectively, represented in FIG. 1d)

According to the aforesaid FIG. 6a, the digital sub-band filtering formed by a prototype filter of low-pass type modulated by a periodic function, this digital sub-band filter for the path or sub-band of corresponding rank k being denoted $h_k(n)$ must correspond to that of a prototype filter of low-pass type, as mentioned previously in the description, modulated by a periodic function. It corresponds, as represented in FIG. 6a, to PRMF filter banks having a segmentation transfer function $h(n) \cdot Ck(n)$, $h(n)$ representing the transfer function of the prototype filter.

The same is true as regards the digital sub-band filter for reconstruction, denoted $g_k(n)$, which corresponds to the same prototype filter with transfer function $h(n)$ modulated by a function $Dk(n)$.

In the devices for segmentation of a digital sub-band signal, respectively for reconstruction, the periodic modulation functions are formed by modules having a transfer function:

$$Ck(n) = 2 \cdot \cos\left( \frac{\pi \cdot (2k+1) \cdot (2n - NF + 1 - SB)}{4 \cdot SB} \right)$$

for the segmentation device.

In the same way, the periodic modulation function for the reconstruction device satisfies the relation:

$$Dk(n) = 2 \cdot \cos\left( \frac{\pi \cdot (2k+1) \cdot (2n - NF + 1 + SB)}{4 \cdot SB} \right)$$

The transfer functions mentioned previously are given by way of example, an identical or near-identical result being obtainable in practice by replacing $Ck(n)$ by $-Ck(n)$ or by devising a different normalization, the normalization corresponding to the coefficient 2 endowing each transfer function, it being possible to take this coefficient equal to another value.

It will be noted that the aforesaid transfer functions have a periodicity law which can be described by the following equalities:

$$Ck(n + 2 \cdot r \cdot SB) = (-1)^r \cdot Ck(n)$$

$$Dk(NF - i - n) = Ck(n).$$

The periodicity properties in the aforesaid processing procedures for filtering followed by sub-sampling, respectively for oversampling followed by filtering in the segmentation, respectively reconstruction procedures, make it possible to reveal the equivalents, at least at functional processing level, of these processings with processings by inverse, respectively direct frequency transform, as will be described later in the description.

In accordance with the aforesaid particularly advantageous aspect, for a string of sample blocks formed of SB samples, the segmentation device which is the subject of the present invention can comprise in cascade, as already mentioned in connection with FIG. 4, a stage 1 for prefiltering the digital input signal $E(mSB+s)$, this prefiltering corresponding to a modified polyphase filtering applied to each sample block in order to deliver components of prefiltered signals.

This stage 1 for prefiltering is followed by a stage 2 for processing by inverse frequency transform of dimension SB of the components of prefiltered signals enabling the sub-band signals $X_k$ to be delivered.

In the same way, the reconstruction device which is the subject of the invention, as represented in FIG. 5, comprises for a plurality of SB sub-band signals for the relevant paths, a stage 3 for processing the sub-band signals by direct frequency transform followed by a stage 4 for postfiltering enabling the sub-band components of the reconstructed digital signal to be delivered.

Indeed, the digital sub-band signals may be written:

$$Xk(m) = \sum_{n=0}^{NF-1} h(n) \cdot Ck(n) \cdot E(m \cdot SB - n)$$

Similarly, the reconstructed points, that is to say the signal reconstructed after segmentation, satisfy the relation:

$$Rec(n) = \sum_{k=0}^{SB-1} \sum_{m \in Z} h(n - m \cdot SB) \cdot Dk(n - m \cdot SB) \cdot Xk(m)$$

It is recalled that in the relations cited above, k denotes the rank of each sub-band, m representing the position of a sample in the sub-band of corresponding rank k, Z denoting the set of relative integers, only a finite number of points being used.

For particular positions in the filter $N_0$, $N_1$ and $N_2$ such as for example:

$$N_0 = (NF-1)/2, \quad N_1 = N_0 + SB/2$$

and
$$N_2 = N_0 - SB/2,$$

these particular values not being limiting, and for parameters for choosing the prototype filter $\theta = 0$ for NF odd, and $= 0.5$ for NF even, the symmetries of the aforesaid transfer functions make it possible to write the relations:

$$Ck(N1 + s + \theta) = Ck(N1 - s - \theta)$$

$$Ck(N2 + s + \theta) = -Ck(N2 - s - \theta)$$

In the aforesaid relations, it is pointed out that s represents a positional index of the coefficient of the corresponding filter, with $s \in [0, SB-1]$.

For filtering products of the filtering applied to each sample satisfying the relation:

$$P_{N1+s+\theta}(m) = \sum_{r \in Z} (-1)^r \cdot h(N1 + s + \theta + 2 \cdot r \cdot SB) \cdot$$

$$E(m \cdot SB - N1 - s - \theta - 2 \cdot r \cdot SB)$$

the modified polyphase filterings satisfy the relations:

$$S_{s+\theta}(m) = 2 \cdot (P_{N1+s+\theta}(m) + P_{N1-s-0}(m)) \text{ if } s+\theta \neq 0$$

and $$S_0(m) = s \cdot \sqrt{2} \cdot P_{N1}(m) \text{ if } s+\theta = 0, \text{ with } s \in [0, SB-1].$$

The sub-band components then satisfy the relation:

$$A_{s+\theta}(m) = \frac{2 \cdot \delta(s+\theta)}{SB} \cdot \sum_{k=0}^{SB-1} \cos\left( \frac{\pi \cdot (2k+1) \cdot (s+\theta)}{2 \cdot SB} \right) \cdot X_k(m)$$

In the aforesaid relation, it is noted that:

$$\delta(s+\theta) = 1/\sqrt{2}, \text{ if } s+\theta = 0,$$

and $\delta(s+\theta) = 1$, otherwise.

It will be noted that the expression given in the above relation for the sub-band components of rank k is identical to that obtained by applying an inverse frequency transform, of inverse DCT type, of size SB applied to the constituent coefficients $S_{s+\theta}(m)$ of the digital input signal prefiltering circuits, this prefiltering thus corresponding to a modified polyphase filtering.

In the case of the inverse processing procedure, that is to say the reconstruction procedure, for an index n denoting the rank of the reconstructed sample, with $n = N2 + s + \theta + r \cdot SB$, with $s \in [0, SB-1]$ and $r \in Z$, the symmetry and periodicity properties already alluded to for the transfer functions $C_k(n)$ and $D_k(n)$ make it possible to establish a reconstructed signal satisfying the relation:

$$Rec(N2 + s + \theta + r \cdot SB) =$$

$$\frac{SB}{\delta(s+\theta)} \cdot \sum_{m \in Z} h(N2 + s + \theta + (r-m) \cdot SB) \cdot A_{s+\theta+(r-m) \cdot SB}(m)$$

In this relation, the expression $A_{s+\theta}(m)$ satisfies the relation:

$$X_k(m) = \sum_{s=0}^{SB-1} \delta(s+\theta) \cdot S_{s+\theta}(m) \cdot \cos\left(\frac{\pi \cdot (2k+1) \cdot (s+\theta)}{2 \cdot SB}\right)$$

and for other values satisfies the relations, with $u \in Z$:

$$A_{s+\theta+(2u+1)_{SB}}(m) = (-1)^{u+1} A_{SB-s-\theta}(m)$$

$A_{SB}(m) = 0$ if NF odd.

In the expression for the reconstructed signal given by the above relation, may be recognized a postfiltering procedure carried out on the coefficients arising from a direct frequency transform of DCT type.

It is noted in particular that the nature of the prototype filter does not come into the derivation of frequency transformations of inverse and direct DCT type in the segmentation and reconstruction operations.

By contrast, the nature of the prototype filter used is linked to the conditions for perfect reconstruction of the input signal after splitting/reconstruction.

In particular, in the case of the coding of images, it is of interest to concentrate the energy over a reduced number of sub-bands, this so as to transmit a minimum of useful information in the domain of the sub-bands. Compliance with the previously mentioned criterion added to the constraints for perfect reconstruction makes it possible to define prototype filters with transfer function $h(n)$ for a PRMF filter bank. Note that, by virtue of a quantization of the values used over a finite number of bits, the filters used will be designated as CPRMF filters, as designated previously.

Thus, for a number of coefficients $NF \leq 2 \cdot SB$, only two solutions are possible and the transfer function of the prototype filter used satisfies the relation:

$$h(n) = \frac{1}{\sqrt{2 \cdot SB}} \cdot \sin \frac{(n+1) \cdot \pi}{2 \cdot SB},$$

with $n \in [0, 2 \cdot SB - 2]$, this relation being satisfied for NF odd, equal to $2 \cdot SB - 1$, and for an even number NF of filter coefficients $NF = 2 \cdot SB$, the transfer function of the prototype filter then satisfies the relation:

$$h(n) = \frac{1}{\sqrt{2 \cdot SB}} \cdot \sin \frac{(n+0.5) \cdot \pi}{2 \cdot SB},$$

with $n \in [0, 2 \cdot SB - 1]$.

It will however be noted that the transfer function $h(n)$ of the relevant prototype filter can be expressed likewise by the rules for correspondence between cosine and sine, without departing from the scope of the subject of the present invention.

The prefiltering respectively postfiltering modules corresponding to a filtering of modified polyphase type, placed at the input of the segmentation device respectively at the output of the reconstruction device, may enable advantage to be taken of the properties of the prototype filter $h(n)$, from which they are deduced, in order to be combined with the rotation trellis modules obtained at the input of the DCT type inverse frequency transformation or with those placed at the output of the DCT type direct frequency transform, these transforms being respectively of type III or IV (see P.YIP and K.R.RAO, "Fast Decimation in Time Algorithms for a Family of Discrete Sine and Cosine Transforms" Circuits Systems Signal Process, Vol 3, No 4, 1984), depending on the number NF of coefficients of the filter bank used. The above remarks, bearing in mind the use of computational charts which are known for the DCT, such as that of Chen, for example, allow a global simplification of the procedure for processing direct and inverse transformations based on the use of PRMF filter banks, in particular in the case which will be described below.

A DCT type transform of type III can be expressed as a function of the real and imaginary parts of a fast Fourier transform FFT and a DCT type frequency transform of type IV obtained for an even number of coefficients of the filter bank used can also be expressed as a function of the real and imaginary parts of an odd FFT fast Fourier transform combined with rotation modules.

The particular form of the previously defined prototype filters then allows the carrying out of prefiltering respectively modified polyphase postfiltering functions making it possible to bring to light a trellis function discussed below.

Figure 7A:
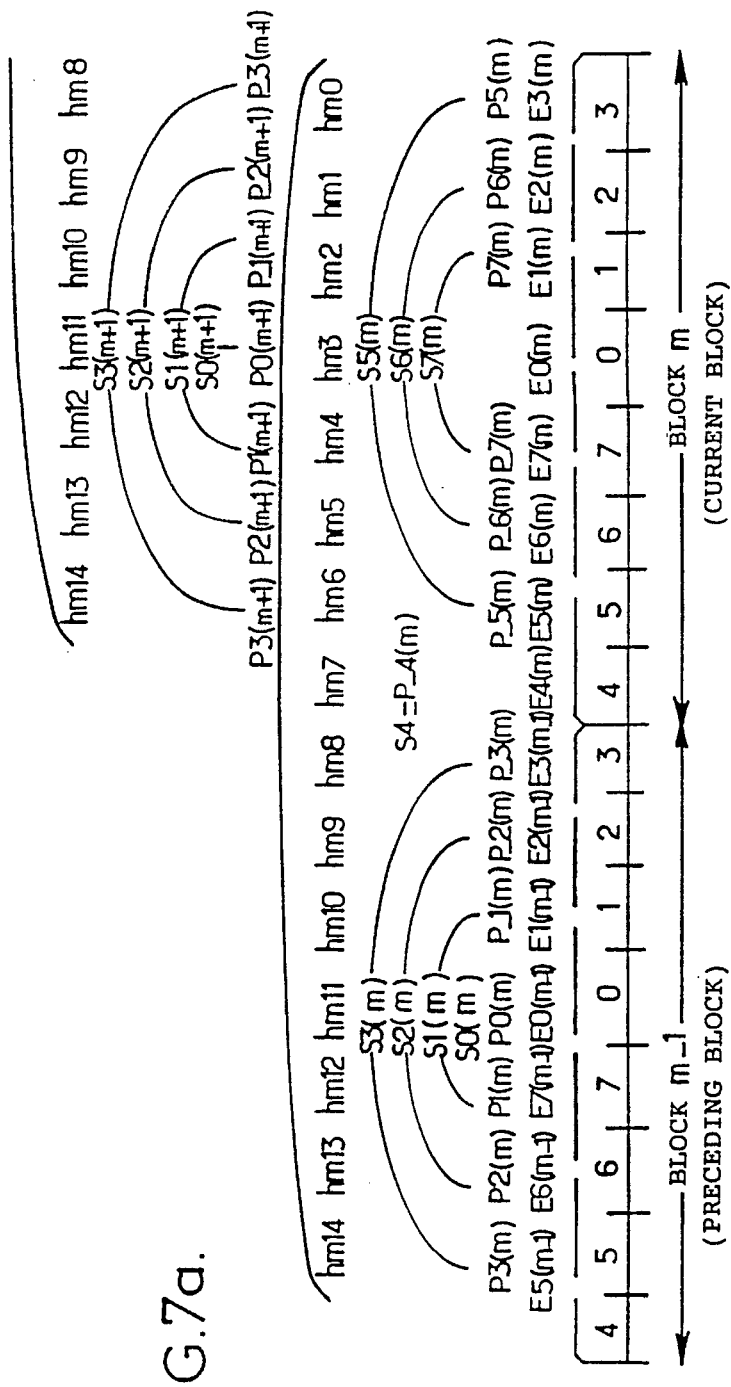
FIG. 7a is an explanatory chart of the operational mode of the complete processing module, more especially of the filtering module making it possible to carry out the filtering function, modified polyphase pre- or postfiltering.
Figure 7F:
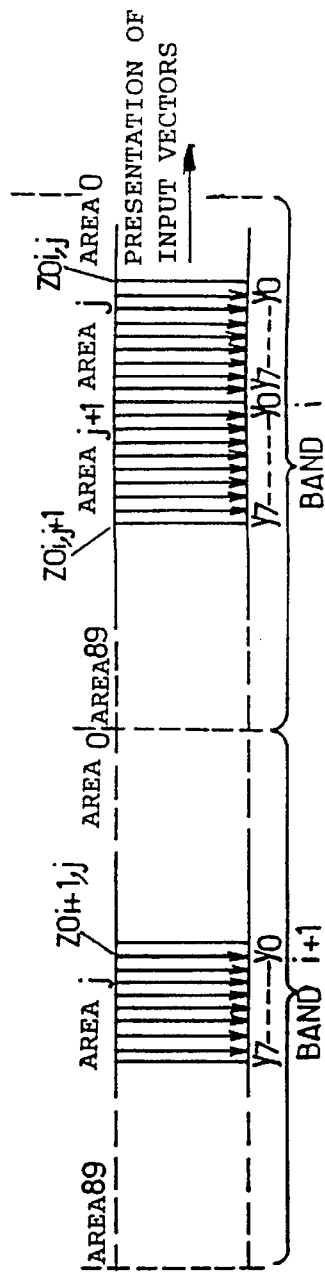
FIG. 7b is a general block diagram of an embodiment of a segmentation device, according to the subject of the present invention, in which a prefiltering followed by an inverse frequency transform is performed on a digital input signal including digital sample blocks.
FIG. 7c is a chart of the transfer function of the device as represented in FIG. 7b.
FIG. 7d is a chart of the transfer function of the same device as represented in FIG. 7b, in the preferred particular case where simplified single modules, such as represented in FIGS. 6d and 6e, are used, FIG. 7e gives a representation, in the context of the separable processing of television picture data with the 4:2:2 format, of the partitioning of such a picture into bands by a given number of lines, FIG. 7f gives a representation of the format of the digital input samples in the case of FIG. 7e, FIG. 7g relates to a basic diagram for storing the intermediate computations for the separable processing mentioned in relation to FIG. 7e.
Figure 7B:
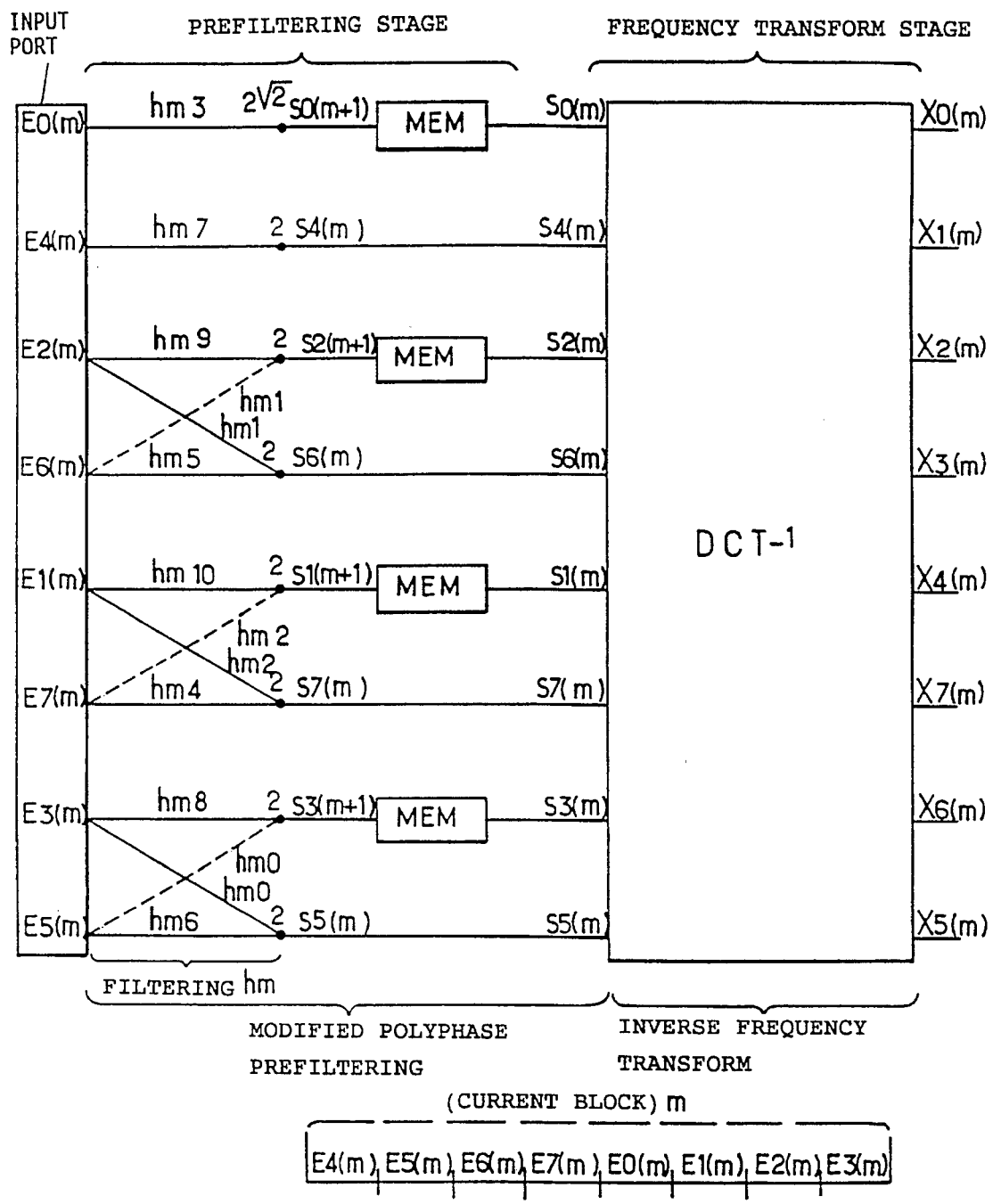

In the description which follows, i denotes the index of the samples classed in the order represented at the foot of FIG. 7b, such as image samples or pixels taken from a sample block of size SB, $$i \in \left[0, \frac{SB}{2} - 1\right]$$

the index i being readily related to the previously mentioned index n of each sample of the input signal connected with the address of each block.

Figure 6B:
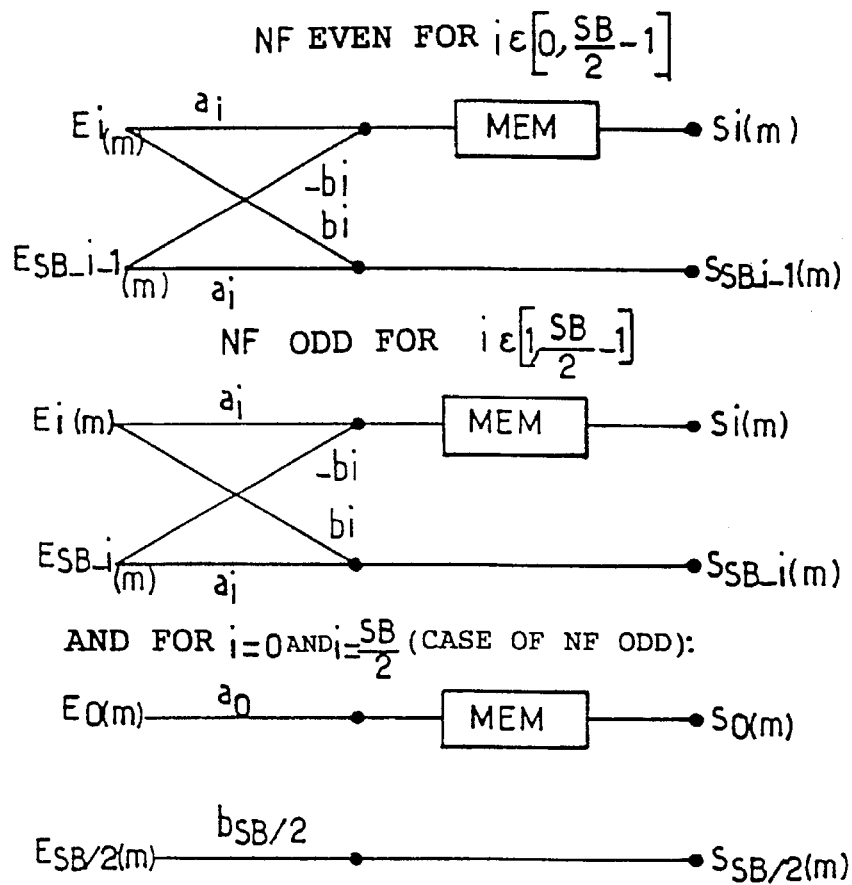
FIG. 6b represents, diagrammatically, in a particular case, an embodiment of filtering modules making it possible to carry out either the prefiltering function, or the postfiltering function of modified polyphase type, in the case where the number of coefficients of the filter bank used is even or odd, and of size less than or equal to 2.SB.

In the aforesaid case, the stages for prefiltering the digital input signal respectively for postfiltering enabling the sub-band components of the reconstructed digital signal to be delivered may then, as represented in FIG. 6b in the case of analysis, be formed by trellis modules whose transfer function satisfies the relation:

$$S_i(m) = a_i \cdot E_i(m-1) - b_i \cdot E_{SB-i-2\theta}(m-1)$$

$$S_{SB-i-2\theta}(m) = a_i \cdot E_{SB-i-2\theta}(m) + b_i \cdot E_i(m)$$

for NF even, with $$i \in \left[0, \frac{SB}{2} - 1\right].$$

For a number NF of elements of the filter of the filter bank used odd, the trellis module satisfies not only the relations mentioned previously for $$i \in \left[1, \frac{SB}{2} - 1\right],$$

this same trellis module furthermore satisfying the relation:

$$S_0(m) = a_0 \cdot E_0(m-1) \text{ for } i=0$$

and $$S_{SB/2}(m) = b_{SB/2} \cdot E_{SB/2}(m) \text{ for}$$

$$i = \frac{SB}{2}$$

It will of course be noted that in these relations, the coefficients $a_i$ and $b_i$ are specified numerical values assigned to the rank i of each sample, these values being obtained from the coefficients of the prototype filter. In the above relations, m and m−1 denote a function for storage and for corresponding delay from the current block m to the earlier block m−1. The trellis functions represented in FIG. 6b are represented for θ=0.5 for NF even, respectively θ=0 for NF odd.

The prefiltering and postfiltering carried out in the previously indicated trellis form, associated with the first stage or with the last stage, also trellis-like, of certain embodiments of inverse respectively direct frequency transforms of type DCT III or IV mentioned previously, make it possible to bring forth various particularly advantageous and simplified parallel structures offering savings in the number of operations (multiplications) of close to 50%.

Figure 6C:
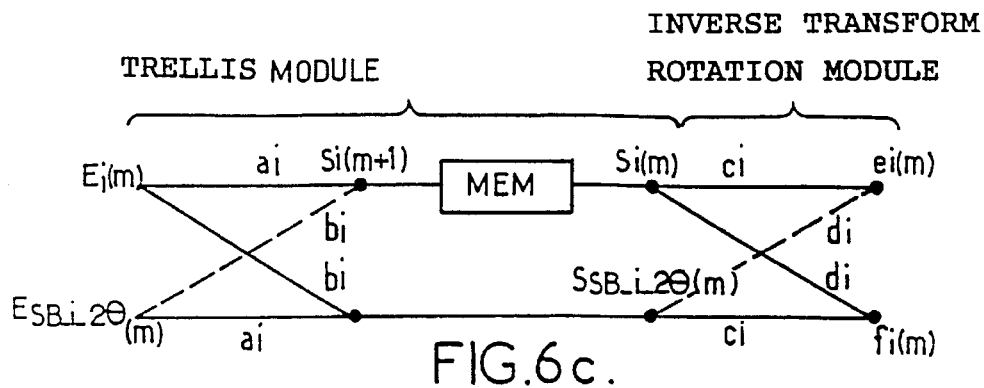
FIG. 6c represents a complete processing module capable of being used for the implementation of either the segmentation or the reconstruction device, this processing module consisting of the combination, in cascade, of a filtering module represented in FIG. 6b and of a rotation module present in various frequency transform embodiments, of inverse or direct TCD type.

As represented in FIG. 6c, the circuits for inverse respectively direct frequency transform processing may be formed by inverse discrete cosine transform input rotation respectively direct discrete cosine transform output rotation modules, these rotation modules having a transfer function for prefiltered signals $S_i, S_{SB-i-2\theta}$ satisfying the relation:

$$e_i(m) = c_i \cdot S_i(m) - d_i \cdot S_{SB-2\theta}(m)$$

$$f_i(m) = c_1 \cdot S_{SB-i-2\theta}(m) + d_i \cdot S_i(m)$$

Thus, the trellis module carrying out the modified polyphase prefiltering and the discrete cosine transform input rotation module are mounted in cascade, as represented in FIG. 6c.

Figure 6D:
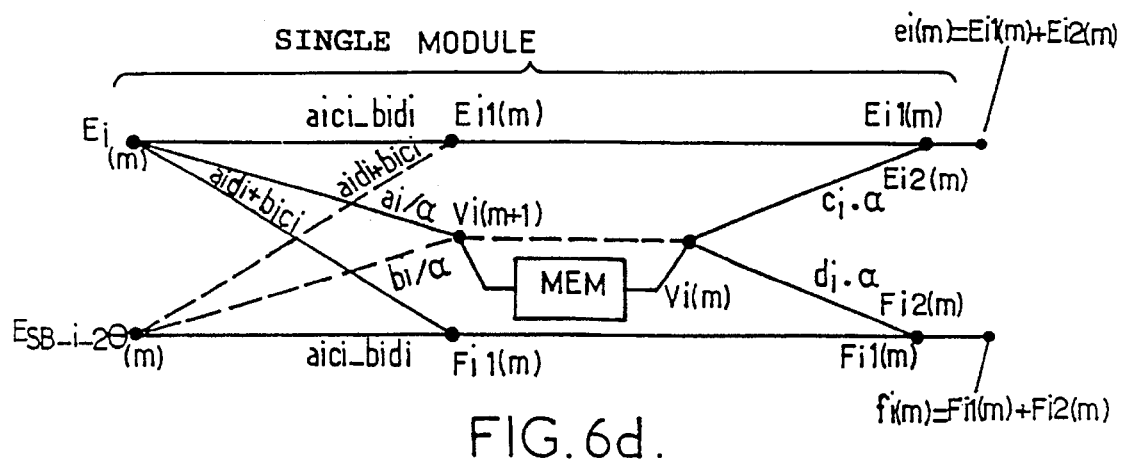
FIGS. 6d and 6e represent simplified single modules carrying out the same general function as the complete processing module represented in FIG. 6c, but allowing a large saving in processing operations.
Figure 6E:
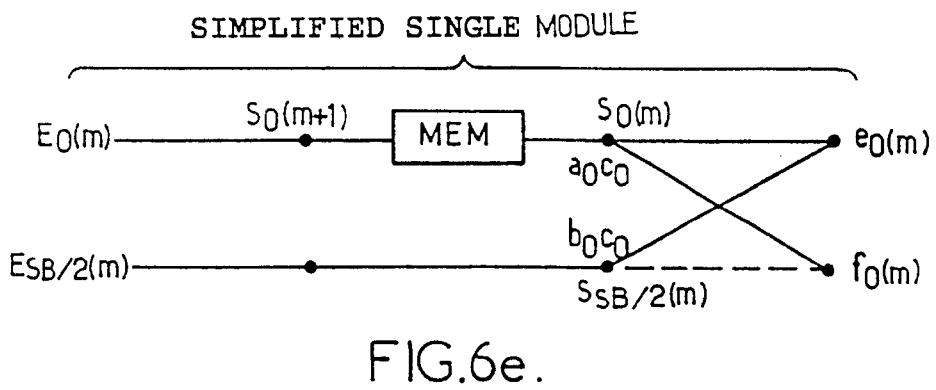

The cascaded modules represented in FIG. 6c may then be reduced, advantageously, to a single module providing for all the processing, as represented in FIGS. 6d and 6e.

The single module as represented in FIG. 6d comprises a direct trellis sub-module whose transfer function satisfies the relation:

$$E_{i1}(m) = [(a_i c_i - b_i d_i) E_i(m) - (a_i d_i + b_i c_i) E_{SB-i-2\theta}(m)]$$

$$F_{i1}(m) = [(a_i d_i + b_i c_i) E_i(m) + (a_i c_i + b_i d_i) E_{SB-i-2\theta}(m)]$$

In the aforesaid relation, the coefficients ai and bi respectively ci and di are the coefficients corresponding to those of FIG. 6c.

It will of course be noted that in FIGS. 6c, 6d and 6e, the continuous lines between two nodes of the trellis modules correspond to a weighted summation by the corresponding coefficient $a_i$ or $c_i$, $b_i$ or $d_i$, whilst the broken lines between two nodes correspond to a weighted subtraction by the aforesaid corresponding coefficients.

Furthermore, with the direct trellis sub-module is associated a parallel sub-module whose transfer function furthermore satisfies the relation:

$$V_i(m+1) = \frac{a_i}{\alpha} \cdot E_i(m) - \frac{b_i}{\alpha} \cdot E_{SB-i-2\theta}(m)$$

$$E_{i2}(m) = [V_i(m) - V_i(m+1)](\alpha \cdot c_i)$$

$$F_{i2}(m) = [V_i(m) - V_i(m+1)](\alpha \cdot d_i).$$

The resulting signal can be written $e_i(m) = E_{i1}(m) + E_{i2}(m)$, $f_i(m) = F_{i1}(m) + F_{i2}(m)$.

In FIG. 6d will be noted the presence of the coefficient α, this coefficient taking a specified value for $$i \in \left[ 0, \frac{SB}{2} - 1 \right]$$

for NF even, and $$i \in \left[ 1, \frac{SB}{2} - 1 \right]$$

for NF odd.

As regards the value of the parameter α, it can be chosen so as to optimize, in the corresponding modules, parameters such as the variability of the coefficients, the representation of the coefficients over a limited number of bits, in a so-called "shifts and adds" construction or other criteria to be optimized. It will in particular be noted that the value of α can be taken equal to α=1/$c_i$ or α=1/$d_i$ or α=$a_i$ or α=$b_i$ so as in fact to remove one multiplication operation.

For an odd number NF of filter coefficients used and i=0 and i=SB/2, the transfer function of the corresponding single module satisfies the relation:

$$e_0(m) = a_0 \cdot c_0 \cdot E_0(m-1) + b_0 \cdot c_0 \cdot E_{SB/2}(m)$$

$$f_0(m) = a_0 \cdot c_0 \cdot E_0(m-1) - b_0 \cdot c_0 \cdot E_{SB/2}(m).$$

In particular, for optimal prototype filters h (n) such as described previously, the values $a_i \cdot c_i - b_i - d_i$ and $a_i d_i + b_i c_i$ become equal with a suitable choice of normalizations of h with +½ or −½, which can be carried out through a simple binary shift of the corresponding coefficient. A particularly interesting advantageous choice can consist in taking:

$$a_i \cdot c_1 - b_i \cdot d_i = a_i d_i + b_i \cdot c_1 = \frac{1}{2}.$$

It will be noted that the example of the determination of the transfer functions of the prefiltering modules of modified polyphase type can be applied without difficulty by virtue of the symmetry established previously in the description, for the postfiltering modules used in the inverse transformation procedure leading to precisely the same number of operations as in the direct transformation procedure.

It will however be noted that it is possible to interchange the direct transformation respectively inverse transformation procedures as described in connection with the process of the present invention.

Indeed, the direct or segmentation transformation can then be split into a DCT type direct frequency transform followed by a postfiltering and the inverse or reconstruction transformation into a prefiltering procedure followed by a DCT type inverse frequency transform type processing.

The device which is the subject of the present invention can therefore be regarded as capable of delivering either DCT type frequency transform coefficients or PRMF sub-band coefficients depending on the option chosen, the possibilities for adapting to future upgrades in hardware for choosing transformations thereby being opened up.

A particular embodiment for a separable splitting into 8×8 sub-bands, with SB=8, of a two-dimensional digital signal of a television picture using a prototype filter of odd length, NF=15=2.SB−1, will now be given in connection with FIGS. 7a et seq. Note that the input data, that is to say the constituent samples of the digital input signal are formed by blocks of 8×8 pixels in the television scanning order, as represented in FIGS. 7e and 7f.

Represented in FIG. 7a is the procedure for filtering the input samples and for creating prefiltered signals according to a modified polyphase filtering. The particular notation adopted for indexing the pixels inside blocks will be observed, which ensures consistency of the indices of the input samples Ei, of the polyphases (or filtering products) Pi and of the values Si (prefiltered signals). This does not correspond with any permutation of the points in a block. The filtering window is placed over the successive blocks with indices m−1 and m as indicated by FIG. 7a. Sums $S_i(m)$ of terms $P_i(m)$ and $P_{-i}(m)$ weighted by a coefficient $2 \cdot \sqrt{2}$ or 2 depending on whether i is zero or not are computed over these blocks. The terms $S_i(m+1)$ appearing in this diagram are included within the processing of the block following the "current block" shown here, and are obtained after right-shifting the filtering window by eight pixels or samples. The values of $S_0(m+1)$, $S_1(m+1)$, $S_2(m+1)$, $S_3(m+1)$, $S_4(m)$, $S_5(m)$, $S_6(m)$, $S_7(m)$ are delivered for each current block with index m. However, the results $S_0(m+1)$, $S_1(m+1)$, $S_2(m+1)$, $S_3(m+1)$ must be stored since they are submitted to the inverse frequency transform with the values $S_4(m+1)$, $S_5(m+1)$, $S_6(m+1)$, $S_7(m+1)$ computed over the succeeding block with index m+1. It is pointed out that a memory saving is possible by offering the pixel $EO(m-1)$ of a "preceding block" instead of the unprocessed pixel $EO(m)$ of the "current block". The number of memories required is then reduced to three.

Bearing in mind the expression for the transfer function of the prototype filter mentioned previously, it becomes:

$$h(n) = \frac{1}{8 \cdot \sqrt{2}} \cdot \cos\left(\frac{(7-n) \cdot \pi}{16}\right), n \in [0,14]$$

We furthermore have the following values for the parameters mentioned previously in the description:

$N_0=7$, $N_1=11$ and $N_2=3$.

The ensuing coefficients can be written, after renormalizaiton by 8:

$$h(0) = \frac{1}{\sqrt{2}} \sin\frac{\pi}{16}$$

$$h(1) = \frac{1}{\sqrt{2}} \sin\frac{\pi}{8}$$

$$h(2) = \frac{1}{\sqrt{2}} \sin\frac{3\pi}{16}$$

$$h(3) = \frac{1}{2}$$

$$h(4) = \frac{1}{\sqrt{2}} \cos\frac{3\pi}{16}$$

$$h(5) = \frac{1}{\sqrt{2}} \cos\frac{\pi}{8}$$

$$h(6) = \frac{1}{\sqrt{2}} \cos\frac{\pi}{16} \text{ and}$$

$$h(7) = \frac{1}{\sqrt{2}} \text{ with } h(14-n) = h(n)$$

From the antisymmetry considerations of the transfer functions $C_k(n)$ and $D_k(n)$ mentioned previously, may be deduced the new expression for the values of the modified filtering coefficients $hm(n)$:

$hm(n) = -h(n)$ for $n \leq 2$, $hm(n) - h(n)$ for $n \geq 3$.

The filtering products $P_i(m)$ resulting from the filtering hm applied to the digital input signal are obtained in accordance with the implementation of FIG. 7a as follows.

The filtering window is placed over the successive blocks with indices m, m−1, as represented in the aforesaid figure.

The results of the filtering $hm(n)$ applied to the digital input signal are represented by the terms $P_i(m)$, i varying from −7 to 7.

The signals $S_i$ denote the signals prefiltered by modified polyphase filtering and are the terms which are submitted to the DCT type inverse frequency transform of size 8, in the direct transformation or segmentation procedure.

The following relations are thus obtained:

Over the current block:

$P_5(m)=hm0 \cdot E_3(m); P_6(m)=hm1 \cdot E_2(m);$ $P_7(m)=hm2 \cdot E_1(m); P_{-7}(m)=hm4 \cdot E_7(m);$ $P_{-6}(m)=hm5 \cdot E_6(m); P_{-5}(m)=hm6 \cdot E_5(m);$ $P_{-4}(m)=hm7 \cdot E_4(m); S_7(m)=2 \cdot (P_7(m)+P_{-7}(m));$ $S_6(m)=2 \cdot (P_6(m)+P_{-6}(m)); S_5(m)=2 \cdot (P_5(m)+P_{-5}(m));$ $S_4(m)=2 \cdot P_{31\ 4}(m)$ Over the preceding block:

$P_{-3}(m)=hm8 \cdot E_3(m-1); P_{-2}(m)=hm9 \cdot E_2(m-1);$ $P_{-1}(m)=hm10 \cdot E_1(m-1); P_1(m)=hm12 \cdot E_7(m-1);$ $P_2(m)=hm(13) \cdot E_6(m-1); P_3(m)=hm(14) \cdot E_5(m-1);$ $P_0(m)=hm11 \cdot E_0(m-1); S_1(m)=2 \cdot (P_1(m)+P_{-1}(m));$ $S_2(m)=2 \cdot (P_2(m)+P_{-2}(m)); S_3(m)=2 \cdot (P_1(m)+P_{-1}(m));$ $S_0(m)=2 \cdot \sqrt{2} \cdot P_0(m).$ However, the results $S_0(m)$, $S_1(m)$, $S_2(m)$, $S_3(m)$ must be stored, these results being submitted to the DCT type inverse frequency transform processing procedure, with the values $S_4(m)$, $S_5(m)$, $S_6(m)$, $S_7(m)$ computed over the succeeding block.

The basic diagram of the whole of the segmentation device for the direct transformation or segmentation procedure for the case where NF=15 and SB=8 is represented in FIG. 7b. The current block of rank m is the one-dimensional processed block of size 8 for separable processing. This current block corresponding to the sample block for the horizontal and vertical directions of the processed video image. It is noted that the values $S_0$, $S_1$, $S_2$ and $S_3$ representing the prefiltered signal in FIG. 7b arise from the processing operations carried out on the preceding blocks by virtue of the presence of the blocks, denoted MEM, allowing storage of the corresponding values of the preceding block, i.e. a delay by a duration of one block. The values indicated at the output of the filtering hm correspond to multiplicative factors equal to $2 \cdot \sqrt{2}$ for the coefficient hm3 and to the value 2 for all the other nodes of the filtering.

Figure 7C:
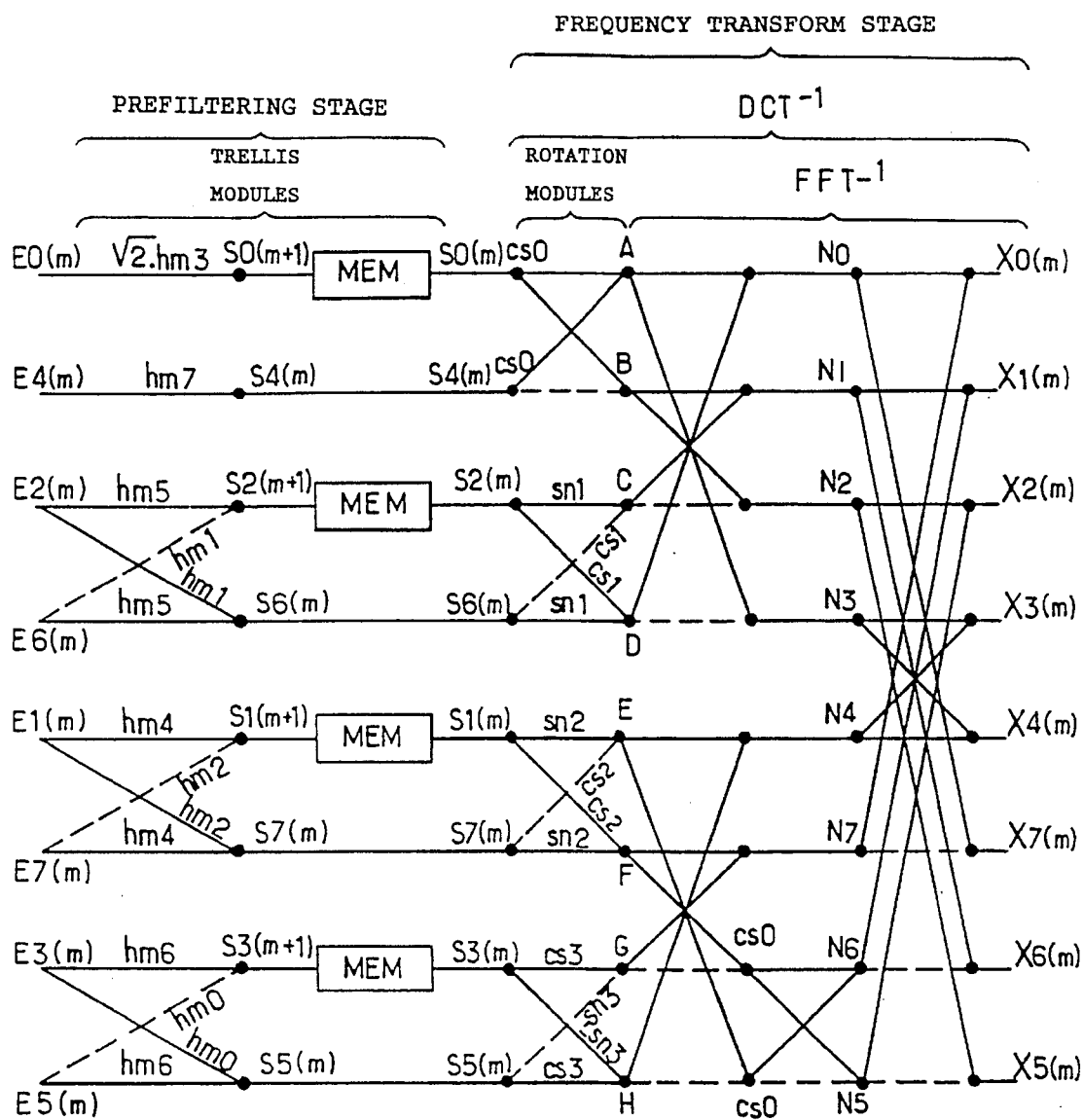

The transfer function of the segmentation or direct transformation device as represented in FIG. 7b is represented before simplification in FIG. 7c. In FIG. 7c it will be observed that the coefficients 2 at each node at the output of the filtering hm have been deleted for the purposes of simplification. Of course, these coefficients can be carried through to the end of processing.

A particular choice for the DCT type inverse frequency transform processing procedure is that enabling the aforesaid inverse transform processing to begin from a rotation trellis set, these rotation trellises being represented in FIG. 7c between the prefiltered signals $S_0(m)$ to $S_7(m)$ and the corresponding points A to H. Apart from the terms csi and sni as well as the coefficients hmn of the filtering hm, the other labels identify the various nodes in the various stages of the processing device. It will be noted that the values taken by the coefficients csi and sni are deduced directly from the coefficients used in a DCT type inverse frequency transform of size 8, these values being as follows:

$$cs0 = \cos\pi/4 = \frac{1}{\sqrt{2}} \;;$$

cs1=cosπ/8; cs2=cosπ/16; cs3=cos3π/16; sn1=sinπ/8; sn2=sinπ/16; sn3=sin3π/16.

Finally, it will be observed that the prefiltered signals obtained after prefiltering by modified polyphase type filtering on the preceding block and which are presented for use over the current block, bear the reference (m) simply indicating the index of the current block.

The transformation of the various cascaded modules consisting of trellis filtering modules hm mentioned previously and storage modules, in fact constituting the modified polyphase type prefiltering stage when the modules are associated with the corresponding storage functions over a block, as described previously in the description, and previously described inverse frequency transform input rotation modules, the signals obtained at the points A to H mentioned previously can be written on taking:

$$V1(m+1)=a/\alpha \cdot E_1(m)-b/\alpha \cdot E_7(m)$$

with a=hm4 b=hm2 c=sn2 d=cs2 and on taking for example $\alpha=1/d$ and on putting;

$$a1 = \frac{1}{\sqrt{2}} \cdot \cos\frac{\pi}{16} \cdot \cos\frac{3\pi}{16}$$

$$b1 = \frac{1}{\sqrt{2}} \cdot \cos\frac{\pi}{16} \cdot \sin\frac{3\pi}{16}$$

$$c1 = \tan\frac{\pi}{16}$$

$$V1(m+1) = a1 \cdot E_1(m) + b1 \cdot E_7(m)$$

$$E = \frac{E_1(m) - E_7(m)}{2} + (V1(m) - V1(m+1)) \cdot c1$$

$$F = \frac{E_1(m) + E_7(m)}{2} + (V1(m) - V1(m+1))$$

a relation in which the index m, m+1 indicates the index of the corresponding blocks.

Similarly, the signals obtained at G and H can be written with $V3(m+1)=a/\alpha \cdot E_3(m)-b/\alpha \cdot E_5(m)$ on putting a=hm6, b=hm0, c=cs3, d=−sn3 and on taking $\alpha=1/c$ furthermore on putting:

$$b3 = \frac{1}{\sqrt{2}} \cdot \cos\frac{\pi}{16} \cdot \cos\frac{3\pi}{16}$$

$$a3 = \frac{1}{\sqrt{2}} \cdot \sin\frac{\pi}{16} \cdot \cos\frac{3\pi}{16}$$

$$c3 = -\tan\frac{3\pi}{16}$$

$$V3(m+1) = a3 \cdot E_5(m) + b3 \cdot E_3(m)$$

$$G = \frac{E_5(m) + E_3(m)}{2} + (V3(m) - V3(m+1))$$

$$H = \frac{E_5(m) - E_3(m)}{2} + (V3(m) - V3(m+1)) \cdot c3$$

The signals obtained at C and D as a function of $E_2(m)$ and $E_6(m)$ are expressed in the same way after reduction on taking $V2(m+1)=a/\alpha \cdot E_2(m)-b/\alpha \cdot E_6(m)$, with a=hm5, b=hm1, c=sn1, d=cs1, and $\alpha=1/d$ on putting:

$$a2 = \frac{1}{\sqrt{2}} \cdot \cos\frac{\pi}{8} \cdot \cos\frac{\pi}{8}$$

$$b2 = \frac{1}{\sqrt{2}} \cdot \cos\frac{\pi}{8} \cdot \sin\frac{\pi}{8} = \frac{1}{4}$$

$$c2 = \tan\frac{\pi}{8}$$

$$V2(m+1) = a2 \cdot E_2(m) + \frac{E_6(m)}{4}$$

$$C = \frac{E_2(m) - E_6(m)}{2} + (V2(m) - V2(m+1)) \cdot c2$$

$$D = \frac{E_2(m) + E_6(m)}{2} + (V2(m) - V2(m+1))$$

Finally, the signals obtained at A and B as a function of $E_0(m)$ and $E_4(m)$ can be written with cs0=1/√2, hm11=½, hm7=1/√2

$A=\frac{1}{2}(S_0(m)+S_4(m))$ $B=\frac{1}{2}(S_0(m)-S_4(m))$.

Advantageously, the similarity is noted between the functions represented after reduction for obtaining signals CD; EF; GH and AB, which will make it possible to facilitate the embodying of the segmentation device which is the subject of the present invention in integrated circuit form, as will be described subsequently in the description.

Figure 7D:
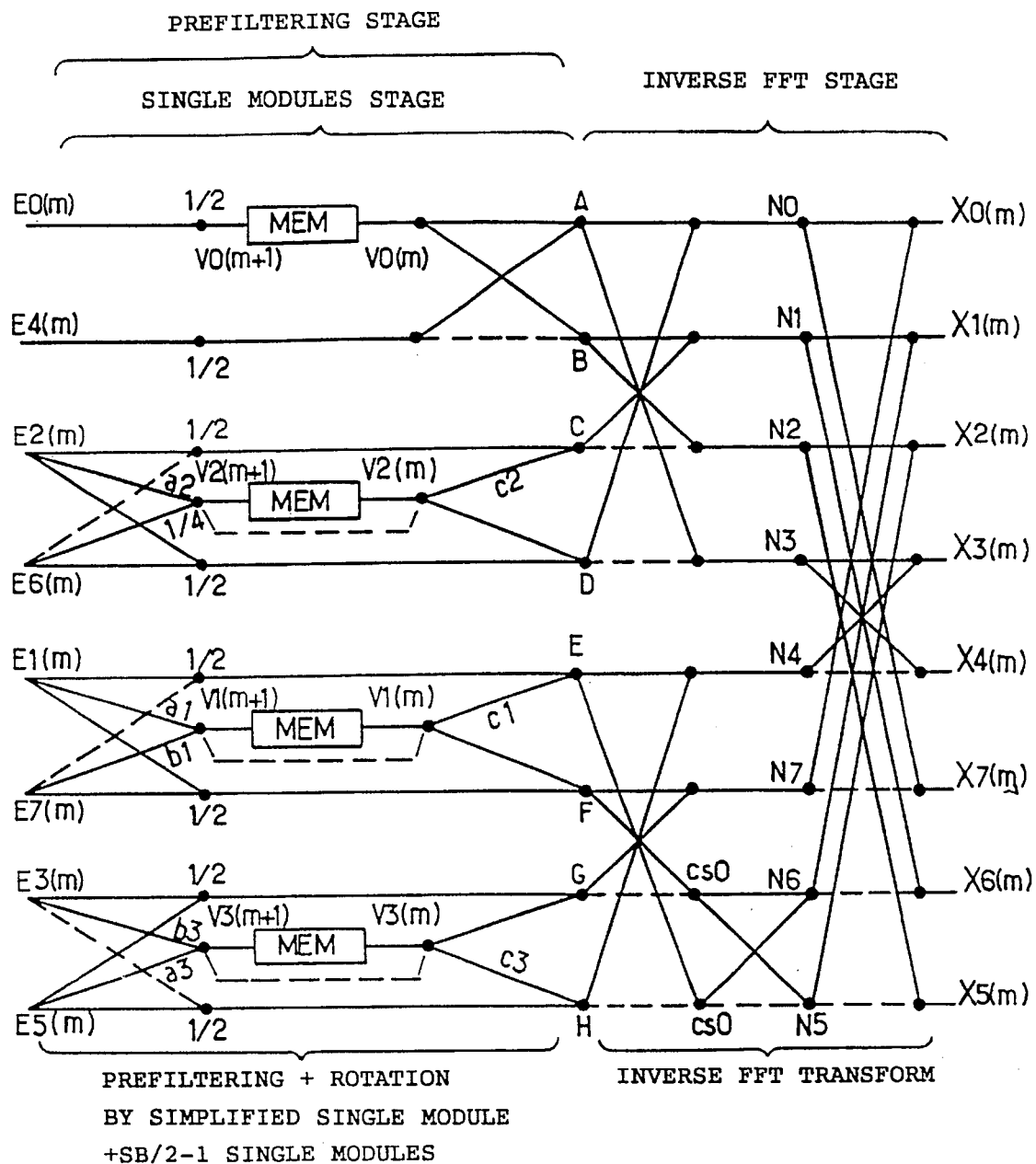
Figure 7E:
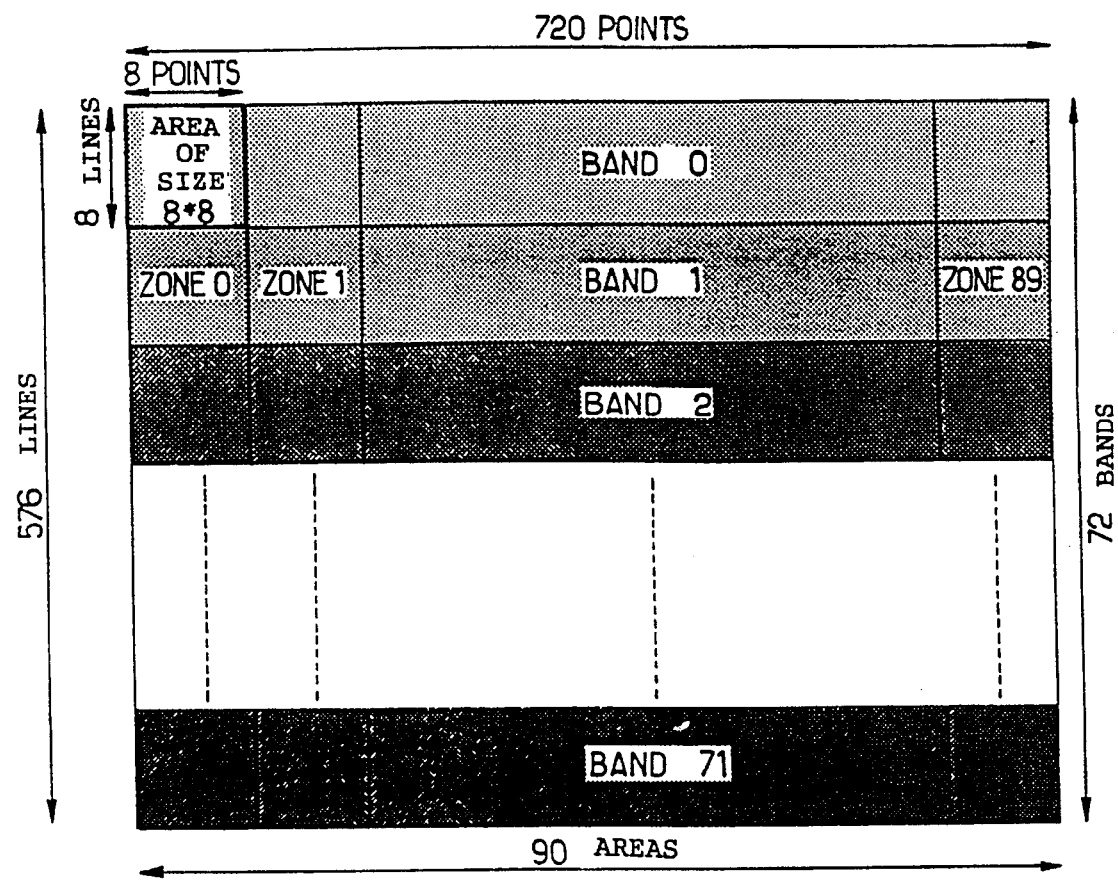

The global representation by means of the simplified single modules described previously for the procedure for direct transformation in a direction X or Y operated on a block of 8 video image pixels, leads to the global diagram represented in FIG. 7d, the single modules being arranged in parallel so as to constitute in fact the sample prefiltering stage as represented in the aforesaid figure. In FIG. 7d, and for the embodiment represented in FIGS. 7b, 7c and 7d of the segmentation device which is the subject of the present invention, in the particular case where NF=15 and SB=8, it is understood that the labels used correspond to the labels previously mentioned in FIGS. 6c, 6d and 6e:

A=$e_0$; B=$f_0$; C=$e_2$; D=$f_2$;

E=$e_1$; F=$f_1$; G=$e_3$; H=$F_3$.

It will be noted that the successive operations on the previously mentioned signals A to H for obtaining signals $N_0$ to $N_7$, then finally as sub-band component $X_0(m)$ to $X_7(m)$ correspond to transformations carried out by butterfly modules of conventional type, which will not be described in detail.

Thus, for the segmentation into sub-bands in the aforesaid case and aforesaid embodiment, the operational cost for obtaining points or signals A to H from samples $E_0$ to $E_7$ is 20 additions and 8 multiplications, the cost for obtaining signals $N_0$ to $N_7$ from signals A to H is 10 additions and 2 multiplications, and the cost of the operations for obtaining sub-band signals $X_0$ to $X_7$ from signals $N_0$ to $N_7$ is 8 additions.

The net cost for the segmentation into 8 sub-bands of a block of 8 pixels, in the aforesaid context, is hence 38 additions and 10 multiplications.

In order to perform the processing of the digital input signals such as mentioned previously, the image as represented in FIG. 7e can be divided up into bands 8 pixels wide traversed in a left to right scan and each split up into areas of size 8×8 for example.

By way of example, an image with the 720 points/line format and 576 lines is split up into 72 bands of 8 lines each band being split up into 90 areas of size 8×8. The circuit firstly carrying out the vertical processing, the input data should be presented in the form of vertical vectors (an area of size 8×8 will therefore be composed of 8 vertical vectors of size 8×1).

The circuit receives as input areas of 8×8 pixels which it organizes into 8 vertical vectors of 8 pixels. For each area, the previously described transformation is advantageously carried out in succession in the Y direction and then, after transposition, in the X direction (separable transformation). The diagram of FIG. 7f presented below illustrates this mode for receiving the input data in the form of blocks vectorized in the Y direction.

In the aforesaid figure, each downward pointing arrow (notation of the type Yk, k taking the values 0 to 7) represents a vertical vector of size 8*1 pixels, 8 vectors Y0 to Y7 constituting an area of size 8×8. Hence, the previously defined bands of each image are scanned in ascending order of their index (band 0 to band 71), area 0 to area 89 (see FIG. 9a), so as to deliver to the circuit a sequence of successive vertical vectors constituting these blocks (see FIG. 9b). The circuit thus begins processing in the vertical direction, in accordance with the preceding considerations.

Figure 7G:
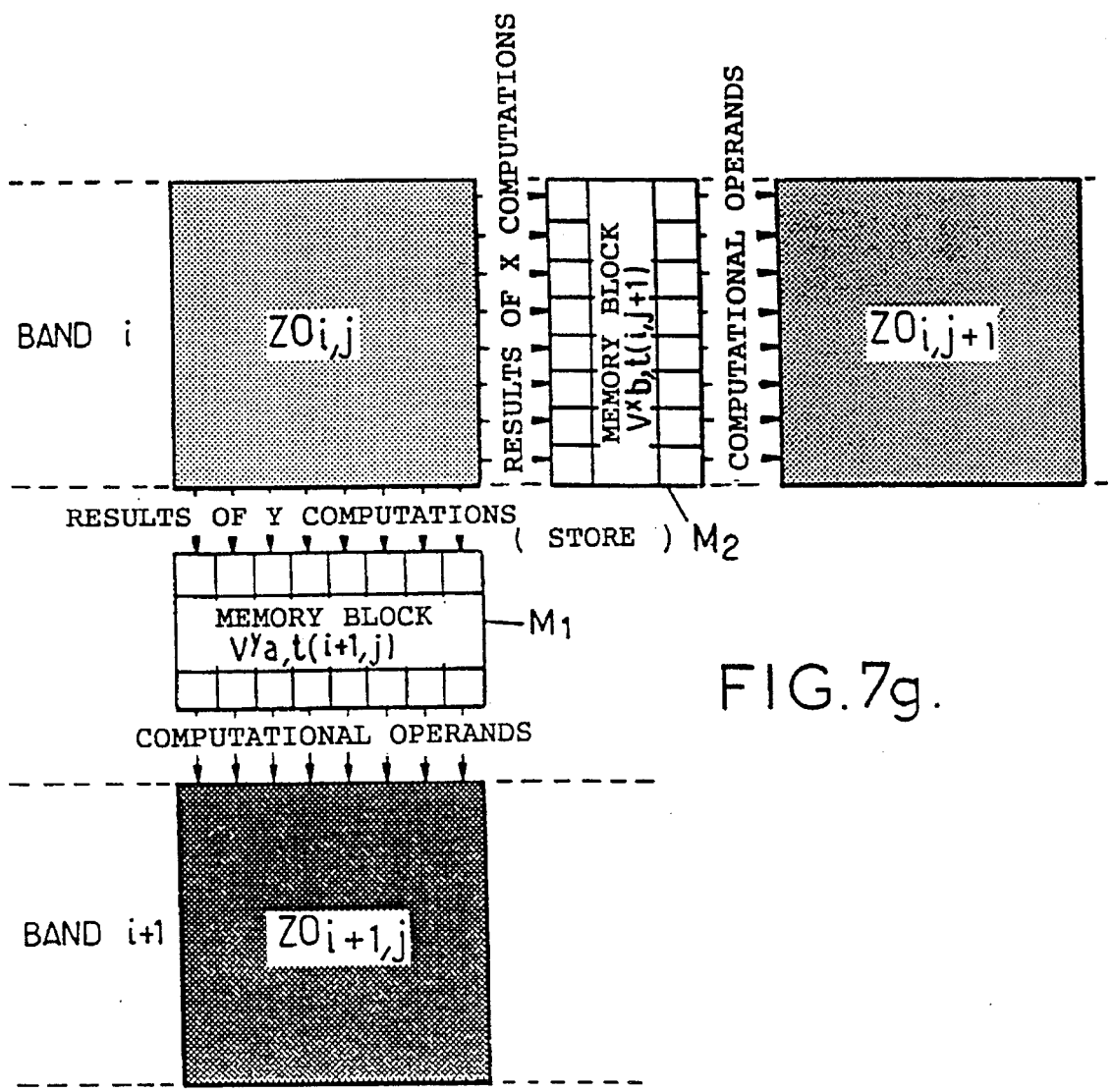

Regarding the device represented in FIG. 7d, in the one-dimensional case of the storages indicated, values $V_t(m+1)$ in the two-dimensional case and in accordance with the scanning adopted above, 4 lines must be stored for the vertical processing and 8 times 4 pixels for the horizontal processing as illustrated in FIG. 7g.

The segmentation device then receives, as input, areas of 8×8 pixels, allowing organization thereof into 8 vertical vectors of 8 pixels. For each area, a scan is thus carried-out in the Y direction and then in the X direction for the segmentation transformation, in the case of a separable mode processing. The input pixels are represented on 9 bits, including one sign bit, and the aforesaid internal multiplication and addition computations can be performed in registers 16 bits wide.

As regards the values V0, V1, V2 and V3 computed in an area j of a band i, denoted $ZO_{i,j}$, and for a vector Ya for the vertical transformation, the latter are stored until the block j of the succeeding band i+1 is processed for the vector Ya, a∈ [0,SB-1].

Indeed, returning to the notations of FIG. 7g, it is noted that for each area j of a band i there are generated:

for the Y processing, an area $V^y_{a,t}(i+1,j)$ wherein are arrayed the 8 times (a∈ [0,7])"4 values $V_t$(t=0,1,2,3)" reused by the vectors Ya of area j of band i+1, for the X processing, an area $V^x_{b,t}(i,j+1)$ wherein are arrayed the 8 times "4 values $V_t(j+1)$ (for t=0,1,2,3)" reused by area j+1 of band i.

It is therefore necessary to provide for a memory M1 of (4*NP*NbitY) bits for the Y processing (NP representing the number of points per line namely 720 in our example, and NbitY representing the accuracy in number of bits in regard to the storing of these values) and for a memory M2 of (4*8*NbitX) bits for the X processing (NbitX representing the accuracy in number of bits in regard to the storing of these values). Delay lines of length NP for vertical processing and of length 8 for horizontal processing, operating on words of NbitY and NbitX respectively, can replace these memories, with the advantage of not having to perform any address management.

A more detailed description of a device for reconstruction or for inverse transformation in the same case where the filter bank includes NF=15 coefficients and where the sub-band signals are 8 in number, $X_0$ to $X_7$, will be given in connection with FIGS. 8a, 8b and 8c.

For the ensuing explanation, the following notation is used:

Zi(m) denotes the output i for the corresponding sample block m, here again the following indexing in a block m: $Z_4$, $Z_5$, $Z_6$, $Z_7$, $Z_0$, $Z_1$, $Z_2$, $Z_3$.

As(m) designates the $s^{th}$ coefficient of the DCT carried out on the sub-band components Xk(m), k∈ [0,SB-1].

The reconstruction terms are weighted by the factor $$\frac{SB}{\delta(s)}$$

so as to display a DCT form beforehand, This term will hence have to be taken into account in the equations which follow, and especially for $Z_0(m)$ where the multiplicative coefficient √2 corresponding to $$\frac{1}{\delta(0)}$$

will have to appear.

In consideration of the above notation, the following equation set is thus available for carrying out the inverse transformation from the sub-band components or signals $X_k(m)$:

$$\begin{bmatrix} Z_s(m-1) \\ Z_{SB-s}(m-1) \end{bmatrix} = \frac{1}{\delta(s)} \begin{bmatrix} h_{3+s} & -h_{3-s} \\ h_{3-s} & h_{3+s} \end{bmatrix} \begin{bmatrix} A_s(m) \\ A_{SB-s}(m-1) \end{bmatrix},$$

$$s \in \left[ 0, \frac{SB}{2} - 1 \right],$$

or equivalently:

$$\begin{bmatrix} Z_s(m-1) \\ Z_{SB-s}(m-1) \end{bmatrix} = \frac{1}{\delta(s)} \begin{bmatrix} hm_{3+s} & hm_{3-s} \\ -hm_{3-s} & hm_{3+s} \end{bmatrix} \begin{bmatrix} A_s(m) \\ A_{SB-s}(m-1) \end{bmatrix}$$

and finally since $$h_s = \frac{1}{\sqrt{2}} \cdot \cos \frac{(s-7) \cdot \pi}{2 \cdot SB}$$

with we obtain:

$$\begin{bmatrix} Z_s(m-1) \\ Z_{SB-s}(m-1) \end{bmatrix} = \frac{1}{\delta(s)\sqrt{2}} \begin{bmatrix} \cos\left[\frac{(4-s)\cdot\pi}{16}\right] & -\sin\left[\frac{(4-s)\cdot\pi}{16}\right] \\ \sin\left[\frac{(4-s)\cdot\pi}{16}\right] & \cos\left[\frac{(4-s)\cdot\pi}{16}\right] \end{bmatrix} \begin{bmatrix} A_s(m) \\ A_{SB-s}(m-1) \end{bmatrix},$$

$$s \in \left[0, \frac{SB}{2}-1\right]$$

and for s=SB/2, we have $$Z_4(m-1) = h7 \cdot A_4(m-1),$$

i.e. $Z_4(m-1) = \frac{1}{\sqrt{2}} \cdot A_4(m-1).$

The inverse transformation, or the procedure for reconstruction from the sub-band components $X_0(m)$ to $X_7(m)$ can then be expressed as follows, by considerations analogous to those relating to the segmentation procedure.

In the following development, DCT(m,s) designates the s/th coefficient of the DCT frequency transform carried out on the m th samples, or pixels taken from the 8 previously cited frequency sub-bands.

The reconstruction terms are weighted by the factor $$\frac{SB}{\delta(s)}$$

for s=0 and s=4, the reconstructed signal component or corresponding output $z_s(m-1)$ can be written:

$$Z_s(m-1) = h(3+s) \cdot DCT(m,s) \cdot \frac{1}{\delta(s)};$$

it will be noted that the coefficient $$\frac{1}{\delta(s)}$$

in this case has the value $\sqrt{2}$ for s=0 and 1 otherwise;

for $1 \leq s \leq 3$, taking into account the expression for:
$Z_s(m-1) = h(3+s) \cdot DCT(m,s) + h(3+SB-s) \cdot DCT(m-1, SB-s)$ ps
and the corresponding expression over the previous block m−1:

$$Z_{SB-s}(m-1) = h(3+SB-s) \cdot DCT(m-1, SB-s) + h(3-s) \cdot DCT(m,s),$$

and with $$h(3+s) = \frac{1}{SB \cdot \sqrt{2}} \cdot \cos\left(\frac{(s-4)\cdot\pi}{2\cdot SB}\right)$$

relations in which h represents the coefficients of the corresponding prototype filter. The expressions for the components of the reconstructed signal satisfy the relations:

$$Z_s(m-1) = \frac{1}{\sqrt{2}} \left[\cos\left(\frac{(4-s)\cdot\pi}{16}\right) \cdot DCT(m,s) - \sin\left(\frac{(4-s)\cdot\pi}{16}\right) \cdot DCT(m-1, 8-s)\right]$$

$$Z_{SB-s}(m-1) = \frac{1}{\sqrt{2}} \left[\sin\left(\frac{(4-s)\cdot\pi}{16}\right) \cdot DCT(m,s) + \right.$$

-continued $$\left. \cos\left(\frac{(4-s)\cdot\pi}{16}\right) \cdot DCT(m-1, 8-s)\right]$$

As for the direct transformation the ratio 1SB is not taken into account, so as to preserve maximum variability in the circuit.

A corresponding correction must however be made on leaving the final stage so as to take this preceding normalization into account.

Figure 8A:
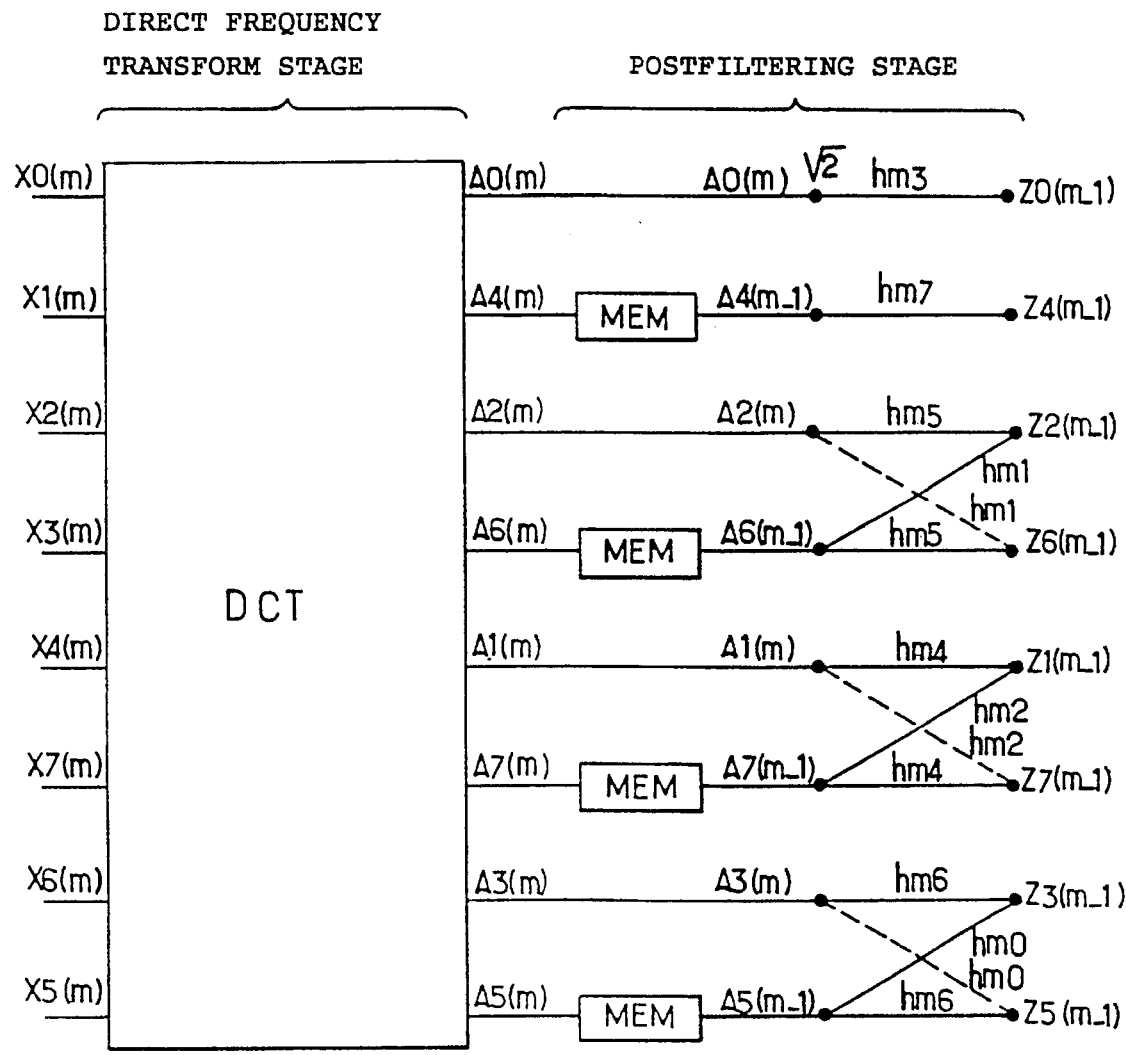
FIG. 8a represents a general block diagram of an embodiment of a device for reconstruction of a digital sub-band signal, according to the subject of the present invention, in which a direct frequency transform is performed, on sub-band components, for a number of sub-bands equal to eight.

It is thus seen that, in a manner dual to the segmentation device represented in FIG. 7b, the reconstruction device which is the subject of the invention, as represented in FIG. 8a, comprises a frequency transform stage, of DCT type, followed by a postfiltering stage formed by storage modules followed by trellis modules, as will be described below.

The global transfer function of the circuit represented in FIG. 8a is itself represented in FIG. 8b with the relations below. It is noted that the relations which follow use the same notation as that used in the direct transformation procedure to denote the coefficients involved in the trellis modules.

The various components of the reconstructed signal can be written:

$$Z_0(m-1) = \sqrt{2} \cdot DCT(m,0) \cdot hm3 = \sqrt{2} \cdot hm3 \cdot A_0(m)$$

$$Z_4(m-1) = DCT(m,4) \cdot hm7 = hm7 \cdot A_4(m-1)$$

$$Z_1(m-1) = \frac{1}{\sqrt{2}} \cdot \left[\cos\left(\frac{3\pi}{16}\right) \cdot DCT(m,1) - \sin\left(\frac{3\pi}{16}\right) \cdot DCT(m-1,7)\right]$$

$$= hm4 \cdot A_1(m) + hm2 \cdot A_7(m-1)$$

$$Z_7(m-1) = \frac{1}{\sqrt{2}} \cdot \left[\sin\left(\frac{3\pi}{16}\right) \cdot DCT(m,1) + \cos\left(\frac{3\pi}{16}\right) \cdot DCT(m-1,7)\right]$$

$$= -hm2 \cdot A_1(m) + hm4 \cdot A_7(m-1)$$

$$Z_2(m-1) = \frac{1}{\sqrt{2}} \cdot \left[\cos\left(\frac{\pi}{8}\right) \cdot DCT(m,2) - \sin\left(\frac{\pi}{8}\right) \cdot DCT(m-1,6)\right]$$

$$= hm5 \cdot A_2(m) + hm1 \cdot A_6(m-1)$$

$$Z_6(m-1) = \frac{1}{\sqrt{2}} \cdot \left[\sin\left(\frac{\pi}{8}\right) \cdot DCT(m,2) + \cos\left(\frac{\pi}{8}\right) \cdot DCT(m-1,6)\right]$$

$$= -hm1 \cdot A_2(m) + hm5 \cdot A_6(m-1)$$

$$Z_3(m-1) = \frac{1}{\sqrt{3}} \cdot \left[ \cos\left(\frac{\pi}{16}\right) \cdot DCT(m,3) - \sin\left(\frac{\pi}{16}\right) \cdot DCT(m-1,5) \right]$$

$$= hm6 \cdot A_3(m) + hm0 \cdot A_5(m-1)$$

$$Z_5(m-1) = \frac{1}{\sqrt{3}} \cdot \left[ \sin\left(\frac{\pi}{16}\right) \cdot DCT(m,3) + \cos\left(\frac{\pi}{16}\right) \cdot DCT(m-1,5) \right]$$

$$= hm6 \cdot A_5(m-1) - hm0 \cdot A_3(m-1)$$

Figure 8B:
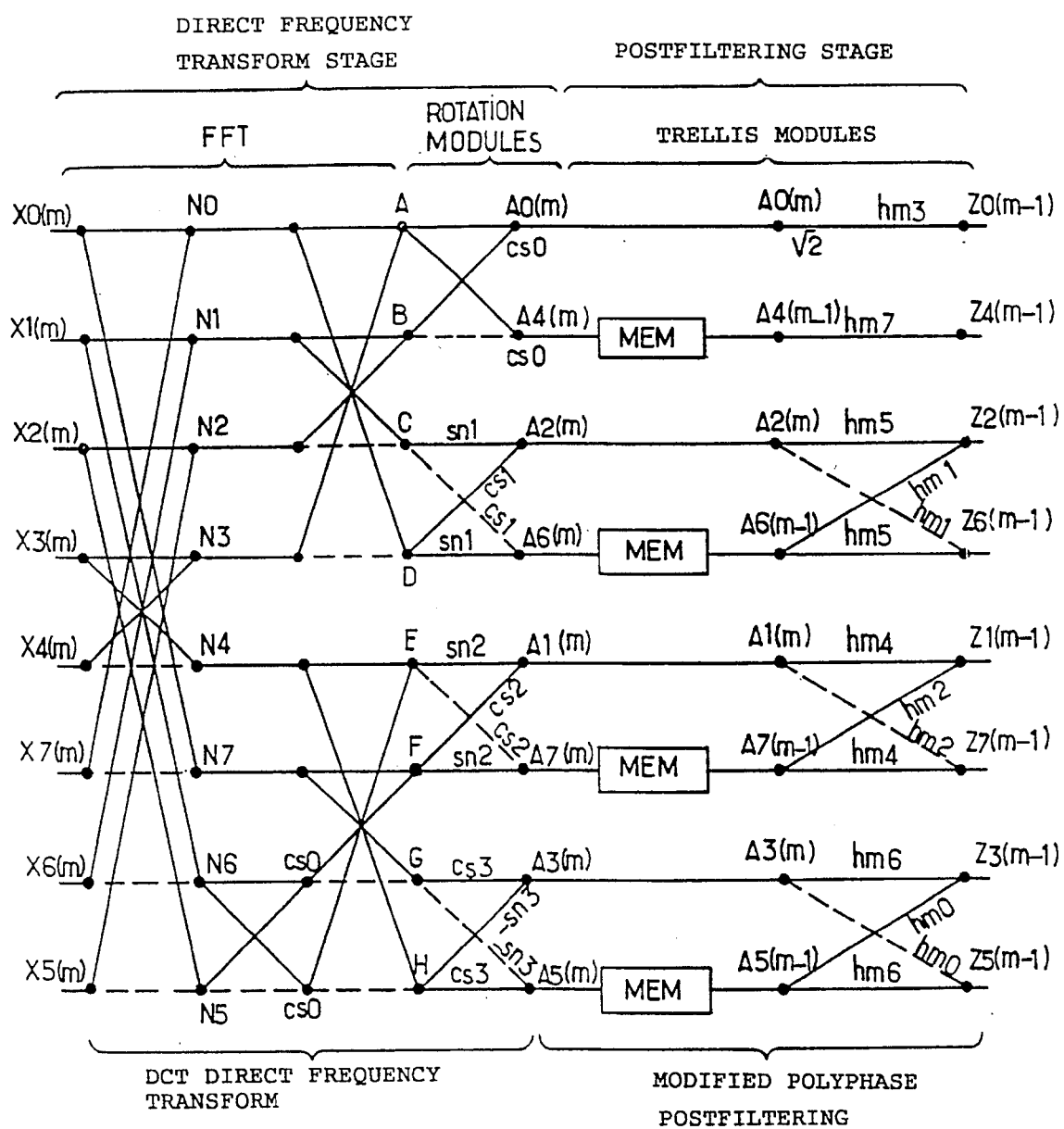
FIG. 8b represents a chart of the transfer function of the device as represented in FIG. 8a, FIG. 8c represents a chart of the transfer function of the same device as that represented in FIG. 8a, in the preferred particular case where single modules and simplified single modules as represented in FIGS. 6d and 6e are used.

In FIG. 8b it is observed that the values of the digital signals denoted $A_0(m)$ to $A_7(m)$ in fact constitute the sub-band components $Xk(m)$ at the input of the circuit represented in FIG. 8a and to which components the DCT type direct frequency transform has been applied. By contrast, the digital signals $Z_0(m)$ to $Z_7(m)$, be they in the current block or in the preceding block, then correspond to the aforesaid direct frequency transform signals $A_0(m)$ to $A_7(m)$ to which the modified polyphase type postfiltering procedure has been applied. These signals $Z_0(m)$ to $Z_7(m)$ thus constitute the components of the reconstructed signal Rec(n). Of course, and in a way analogous to the device relating to segmentation, the memory blocks MEM constituting the storage modules allow storage of the intermediate signals with a delay from one block to the next block.

In FIG. 8b the coefficients indicated next to the nodes correspond to multiplicative coefficients, the letters denoting the signals at the corresponding nodes.

Similar reasoning to that just established in the case of the direct transformation, or segmentation, shows that the coefficients of the output trellis modules, that is to say placed after the storage blocks MEM, are also associated with the trellis modules for rotating the DCT direct frequency transform. This to within a √2 normalization on analysis and on synthesis in the prototype filter h. This remark makes it possible to envisage the design of an integrated circuit capable of having the advantage of possessing the same trellises duplicated or else trellises working at twice the speed and therefore carrying out both operations, postfiltering and direct DCT frequency transform output rotation.

The values taken by the coefficients cs0 to cs3 and sn0 to sn3, values which are made specific when studying the direct transformation in the context of the segmentation device, are deduced directly from the coefficients used in a frequency transform of direct DCT type of size 8.

The coefficients present in FIG. 8b have been defined in the section relating to the study of the direct transformation earlier in the description.

Figure 8C:
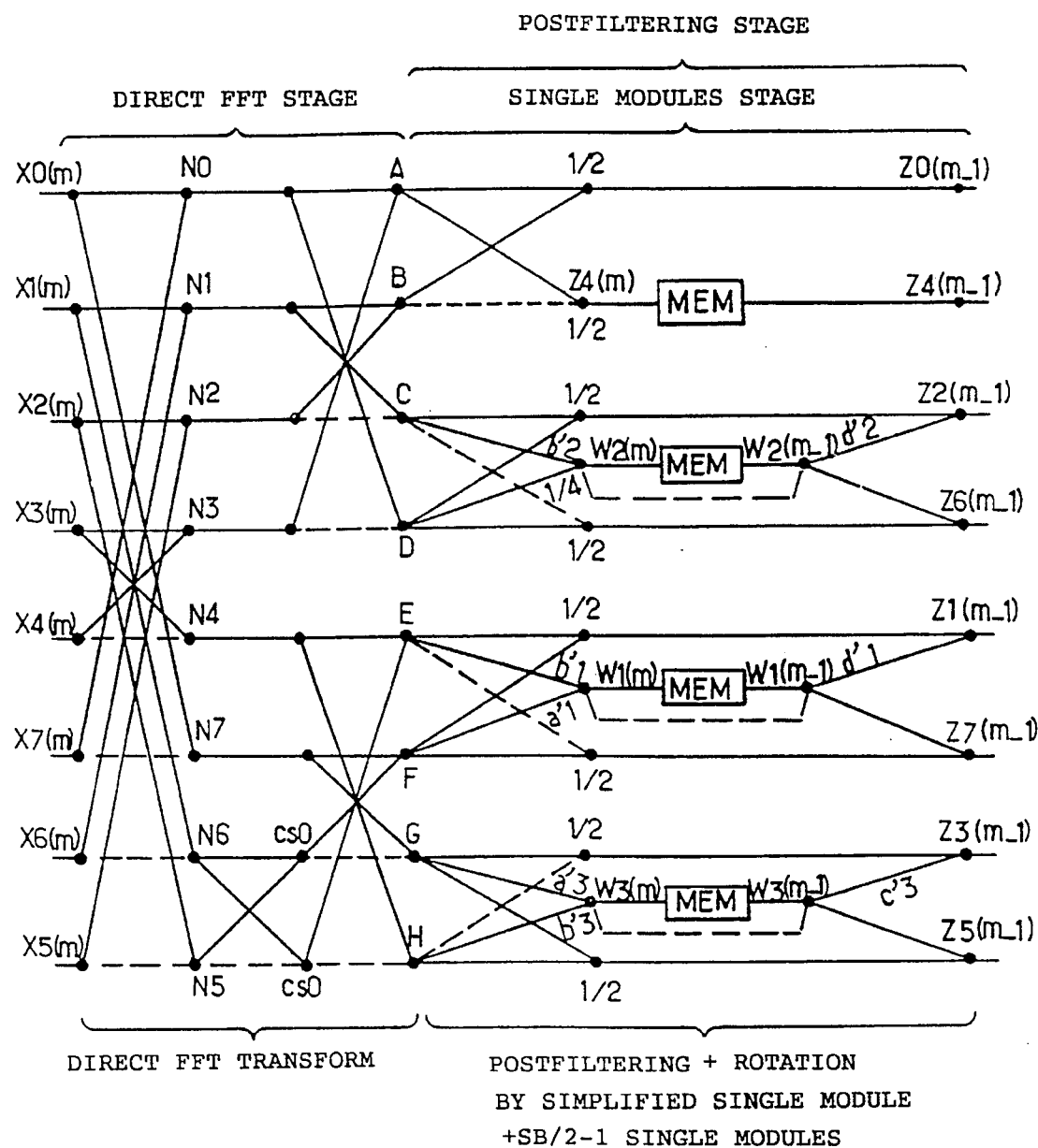
FIG. 8d represents in overview an embodiment of a device according to the invention, a device for segmentation, respectively for reconstruction, embodied with PRMF or CPRMF filters.

An approach similar to that which led to the definition of a segmentation device as represented in FIG. 7d, in which single modules are arranged in parallel so as to constitute the segmentation device, may be undertaken in relation to the reconstruction device, the latter then being formed of single modules arranged in parallel so as to constitute the postfiltering stage supplemented with the rotation trellis modules of the frequency transform output stage, as represented in FIG. 8c. Each unit includes, for an odd number of filter coefficients NF=15, in the illustrative embodiment given with FIG. 8c, a simplified single module delivering the components of reconstructed signals $Z_0(m-1)$ and $Z_4(m-1)$ and a plurality of $\frac{SB}{2} - 1$ single modules respectively delivering the reconstructed signals $Z_2(m-1)$, $Z_6(m-1)$, $Z_1(m-1)$, $Z_7(m-1)$, $Z_3(m-1)$ and $Zs(m-1)$. It will of course be noted, in a manner dual to the sub-band decomposition module, that the reconstruction module as represented in FIG. 8c includes a frequency transform stage of direct FFT type associated with the stage of single modules, as will be explained below.

With notation similar to that already used in relation to FIG. 7d, the components of the reconstructed signal can be written in succession:

$$Z_0(m-1) = \frac{1}{\sqrt{2}} (A+B) \cdot \sqrt{2} \cdot hm3 = \frac{A+B}{2}$$

$$Z_4(m) = \frac{1}{\sqrt{2}} (A-B) \cdot hm7 = \frac{A-B}{2}$$

Furthermore, for $Z_1(m-1)$ and $Z_7(m-1)$: with $$a = sn2 = \sin\frac{\pi}{16}$$

$$b = cs2 = \cos\frac{\pi}{16}$$

$$c = hm4 = \frac{1}{\sqrt{2}} \cdot \cos\frac{3\pi}{16}$$

$$d = hm2 = -\frac{1}{\sqrt{2}} \cdot \sin\frac{3\pi}{16}$$

taking for example $\alpha=1/c$, we obtain, on putting $$a'1 = \frac{1}{\sqrt{2}} \cdot \sin\frac{\pi}{16} \cdot \cos\frac{3\pi}{16}$$

$$b'1 = -\frac{1}{\sqrt{2}} \cdot \cos\frac{3\pi}{16} \cdot \cos\frac{\pi}{16}$$

$$c'1 = 1$$

$$d'1 = -\tan g\frac{3\pi}{16}$$

$$W_1(m) = a'1 \cdot F + b'1 \cdot E$$

$$Z_1(m-1) = \frac{F+E}{2} + (W_1(m-1) - W_1(m)) \cdot d'1$$

$$Z_7(m-1) = \frac{F-E}{2} + (W_1(m-1) - W_1(m))$$

and for $Z_3(m)$ and $Z_5(m)$: with $$a = cs3 = \cos\frac{3\pi}{16}$$

$$b = -sn3 = -\sin\frac{3\pi}{16}$$

$$c = hm6 = \frac{1}{\sqrt{2}} \cdot \cos\frac{\pi}{16}$$

$$d = hm0 = -\frac{1}{\sqrt{2}} \cdot \sin\frac{\pi}{16}$$

and taking for example α=1/c, we obtain, on putting $$b'3 = \frac{1}{\sqrt{2}} \cdot \cos\frac{3\pi}{16} \cdot \cos\frac{\pi}{16}$$

$$a'3 = \frac{1}{\sqrt{2}} \cdot \sin\frac{3\pi}{16} \cdot \cos\frac{\pi}{16}$$

$$c'3 = -\tan\frac{\pi}{16}$$

$$d'3 = 1$$

$$W_3(m) = a'3 \cdot G + b'3 \cdot H$$

$$Z_3(m-1) = \frac{G-H}{2} + (W_3(m-1) - W_3(m)) \cdot c'3$$

$$Z_5(m-1) = \frac{G+H}{2} + (W_3(m-1) - W_3(m))$$

and for $Z_2(m-1)$ and $Z_6(m-1)$: with $$a = sn1 = \sin\frac{\pi}{8}$$

$$b = cs1 = \cos\frac{\pi}{8}$$

$$c = hm5 = \frac{1}{\sqrt{2}} \cdot \cos\frac{\pi}{8}$$

$$d = hm1 = -\frac{1}{\sqrt{2}} \cdot \sin\frac{\pi}{8}$$

and taking for example α=1/c, we obtain, on putting $$a'2 = \frac{1}{\sqrt{2}} \cdot \cos\frac{\pi}{8} \cdot \sin\frac{\pi}{8} = \frac{1}{4}$$

$$b'2 = -\frac{1}{\sqrt{2}} \cdot \cos\frac{\pi}{8} \cdot \cos\frac{\pi}{8}$$

$$c'2 = 1$$

$$d'2 = -\tan\frac{2\pi}{8}$$

$$W_2(m) = b'2 \cdot C + \frac{D}{4}$$

$$Z_2(m-1) = \frac{D+C}{2} + (W_2(m-1) - W_2(m)) \cdot d'2$$

$$Z_6(m-1) = \frac{D-C}{2} + (W_2(m-1) - W_2(m)).$$

Examination of FIGS. 7d and 8c described earlier shows the similarity existing between the set of functions represented earlier both in the segmentation device and in the reconstruction device represented and described in connection with the aforesaid figures. Such similarity makes it possible to facilitate the installation of these circuits and transformation devices in the direct respectively inverse direction when PRMF or CPRMF filters are used, particularly in integrated circuit form.

Firstly, examination of FIGS. 7d and 8c relating to the segmentation reconstruction device which is the subject of the invention, shows that the corresponding transfer functions contain as sub-portions the elementary transfer functions for NF=7 and SB=4, the portion $E_0(m)$, $E_2(m)$, $E_4(m)$, $E_6(m)$ to $N_0$, $N_1$, $N_2$, $N_3$ respectively $N_0$, $N_1$, $N_2$, $N_3$ and $Z_0(m)$, $Z_4(m)$, $Z_2(m)$, $Z_6(m)$ as well as for NF=8 and SB=4, portion $E_1(m)$, $E_3(m)$, $E_5(m)$, $E_7(m)$ to $N_4$, $N_5$, $N_6$, $N_7$, respectively $N_4$, $N_5$, $N_6$, $N_7$ to $Z_1(m)$, $Z_3(m)$, $Z_5(m)$ and $Z_7(m)$. Of course, for SB equal to a multiple of 2 and NF odd, the procedure can be repeated on each branch for an odd PRMF filter, as will be described below in connection with FIG. 8d in the general case.

The prototype filter h(n) is then subdivided by a first subdivision of rank q, q=1 for example, into a first and a second elementary filter, obtained by taking every other coefficient of the filter h(n), that is to say choosing n even or odd. Such a subdivision has been represented in FIG. 8d, the odd filter with NF coefficients for the processing of SB sub-bands being labeled 1, the first and second elementary filters being labeled 12, respectively 11. The first elementary filter includes an even number of coefficients and the second elementary filter includes an odd number of coefficients.

Figure 8D:
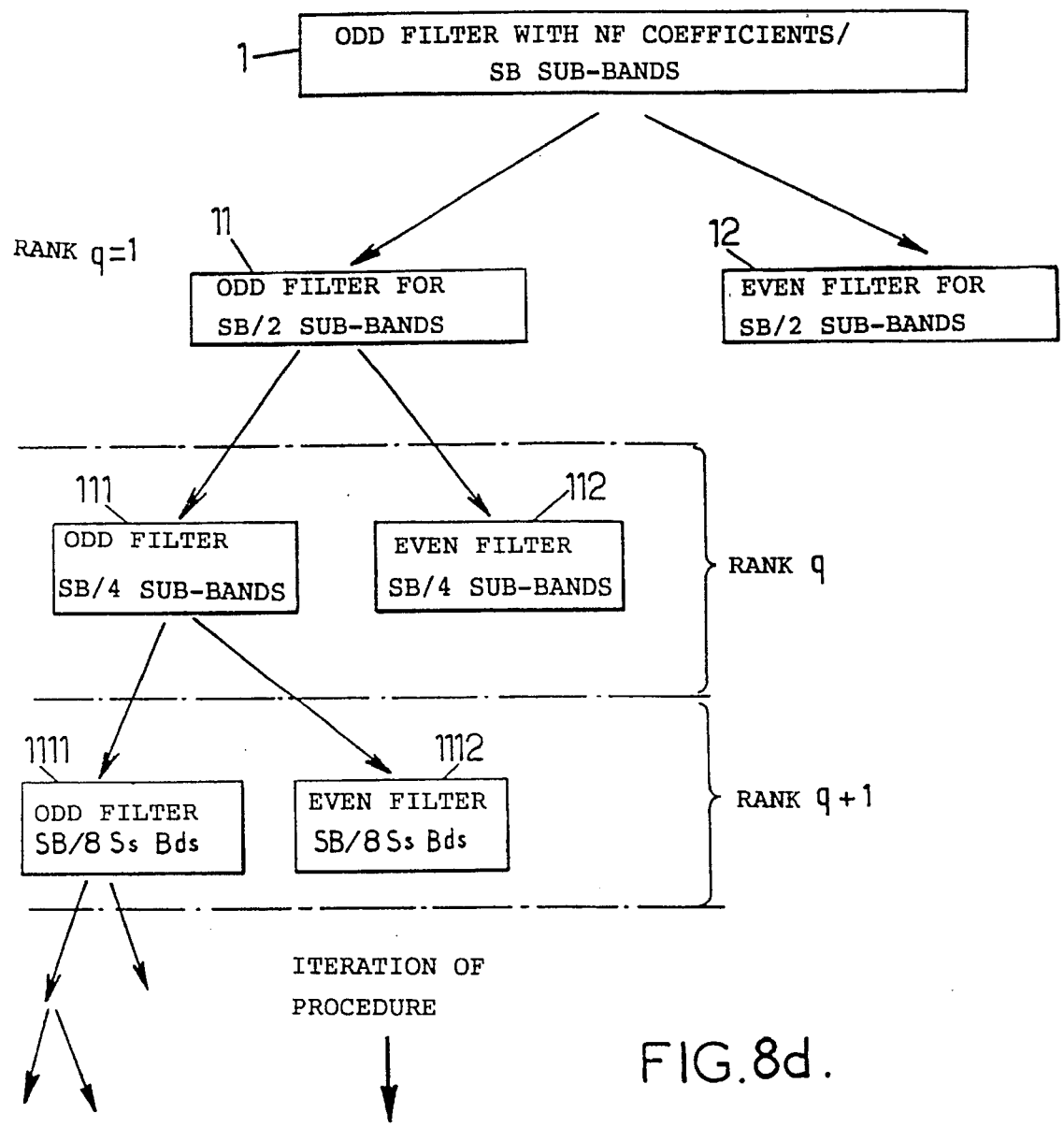

As has furthermore been represented in FIG. 8d, each second elementary filter, the elementary filter 11 of rank q=1 cited earlier, may in turn be subdivided by successive subdivision of higher rank q+1 into a first, 112, and into a corresponding second elementary filter of rank q+1, labeled 111. The first, 112, and second, 111, elementary filters of rank q+1 comprise respectively an even and odd number of coefficients. Each first respectively second elementary filter, 12, 112, 1112, for the successive ranks q, and respectively, 11, 111, 1111, for the same ranks, is intended for processing $SB/2^q$ sub-bands, where SB denotes the number of sub-bands. The procedure can be continued for higher ranks q+1, while the second odd filter of higher rank may again be submitted to the subdivision procedure. It will of course be noted that in such a case, the number SB of sub-bands is equal to a power of 2.

Thus, the configuration of the prototype filter used can be variable, sequentially in tempo with the transmission of the sample blocks. The filter can then be used as is or else switched into various configurations of sub-filters. Such an operational mode enables switching to be performed in tempo with the areas or blocks, it being possible to control this switching by a criterion for coding motion over the relevant blocks when the samples relate to video image samples, or by an energy criterion, for example when the signal transmitted is a digital video and/or audio signal, it also being possible to use the switching criterion for the transmission of the right and left paths of a stereophonic sound, when the digital input signal is a corresponding digital audio signal.

It will be understood that the number NF of coefficients of the filter of the filter bank used to obtain the aforesaid property must be of odd length and advantageously satisfy the relation:

$$NF=2SB-1.$$

The technique described earlier for creating two elementary filters from an odd filter may thus be implemented in succession as represented in FIG. 8d. It is thus understood that the implementation of a PRMF filter containing an odd number of coefficients in fact embraces all the embodiments of the corresponding elementary filters.

Secondly, it is seen that the cost of the operations for carrying out the elementary functions described in connection with the aforesaid figures, both in the case of the inverse transformation and in the case of the direct transformation, is identical. It is thus noted that the number of operations required in the reconstruction phase is strictly identical to that of the phase for splitting into sub-bands as mentioned earlier in the description.

Such an installation in integrated circuit form is thus facilitated by the dual character of the various constituent modules of the segmentation respectively reconstruction circuits or devices in accordance with the subject of the present invention.

Figure 9A:
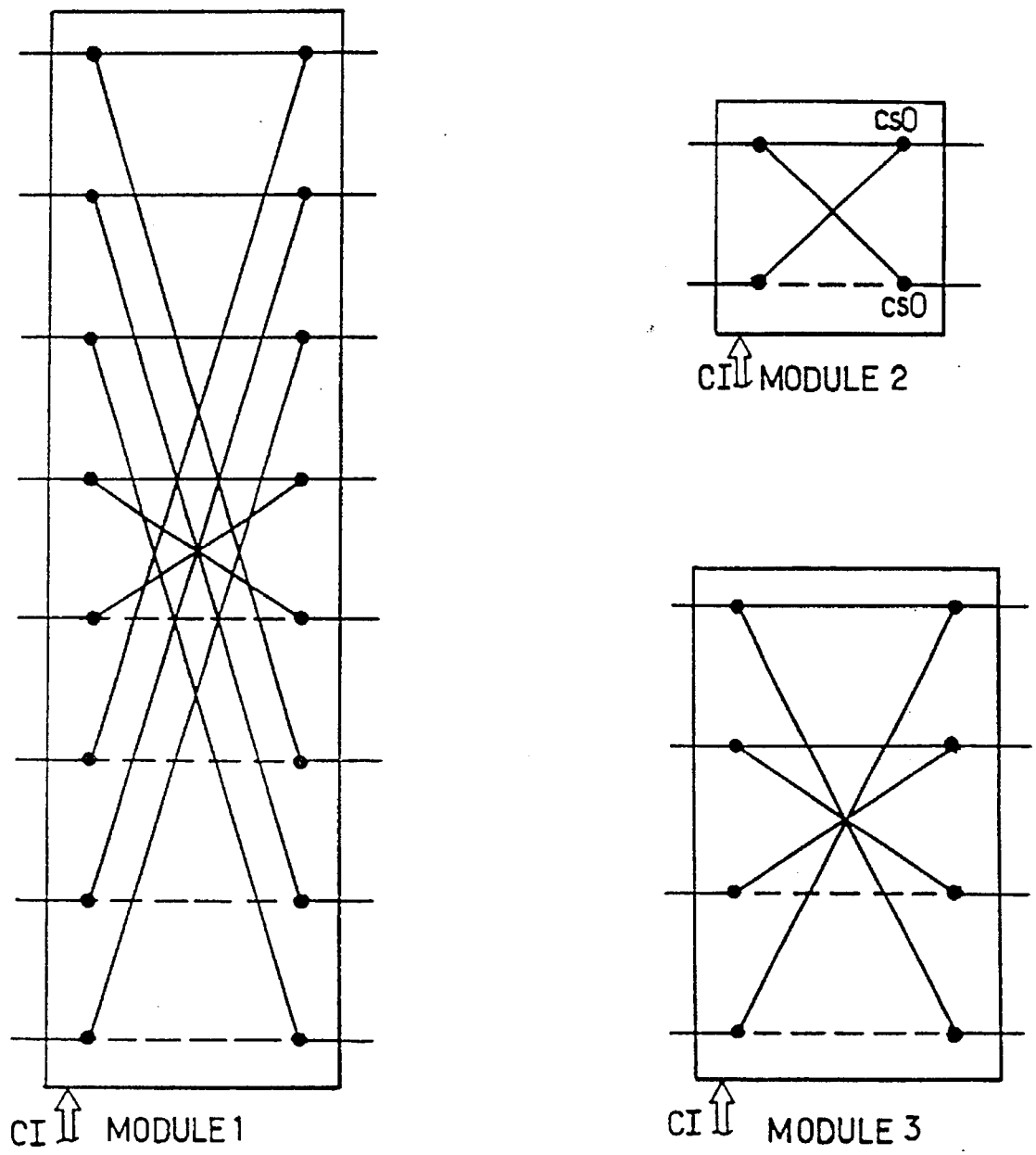
FIGS. 9a, 9b, 9c represent various typical modules specially adapted for constructing, in integrated circuit form, the segmentation respectively reconstruction device as represented in FIGS. 7b, 7d, respectively 8a, 8c.

Thus, for an embodiment of this device in integrated circuit form, the latter may include, as represented in FIG. 9a, at least one butterfly module, labeled Module1, present in a fast Fourier transform FFT of size SB, at least one butterfly module present in a fast Fourier transform FFT of size SB/2, this module being labeled Module3 in FIG. 9a, and at least one elementary rotation module intended to provide for the interconnection of the butterfly module of size SB and of the aforesaid butterfly module of size SB/2, or of each of these modules. It is understood that this rotation module denoted by Module2 in FIG. 9a makes it possible to provide for the link between the butterfly module, Module1, and butterfly module, Module3. It is of course understood that in the case of a number of sub-bands SB>8, it is conceivable to carry out the interconnecting of several modules of size $SB/2^q$ to butterfly modules of size $SB/2^q$ if necessary.

Figure 9C:
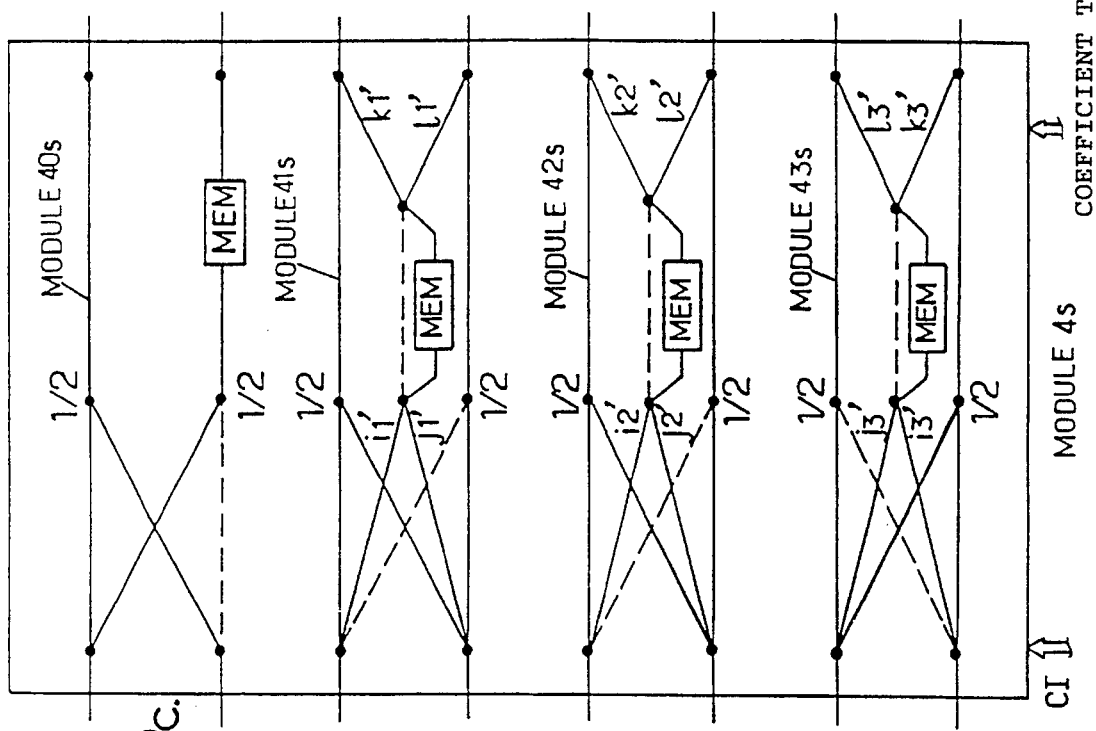
Figure 9B:
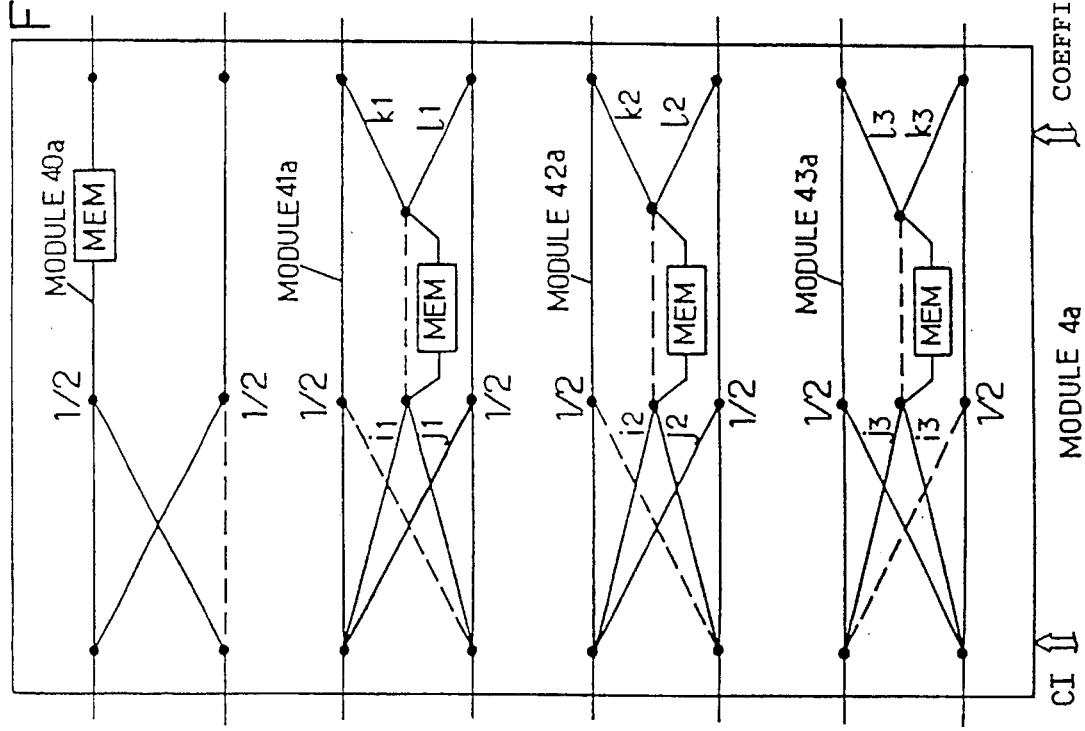

Finally, the integrated circuit according to the subject of the present invention includes a plurality of single modules such as represented in FIGS. 9b and 9c denoted by Module 4a grouping together all these single modules, this module including at least one simplified single module denoted by module 40a respectively 40s and SB/2–1 single modules, labeled modules 41a to 43a in FIG. 9b, these modules being intended to provide for the prefiltering of the samples of the digital input signal, respectively the postfiltering of the signals with transformed sub-band components. It is recalled that all these modules may be produced from networks of multiplier circuits interconnected so as to produce the transfer functions sought and represented in FIGS. 7d and 8c. In FIGS. 9b and 9c, the labels $i_1$, $j_1$ and $i_1'$, $j_1'$ denote multiplicative values specific to analysis respectively synthesis.

It is noted that each module, such as represented in FIGS. 9a, 9b and 9c, comprises an activation/transparency control input CI connected to a corresponding control BUS, this making possible, on setting one or more modules to transparency, identical transmission of the data at the input of the relevant module(s) to the output of the latter. Such a measure makes it possible, within the video image processing described earlier for example, to perform separate processing of the even or odd coefficients, it being possible to assign the even coefficients to the first frame and the odd coefficients to the second frame of the video image. It is also noted that control is performed preferably by addressing at the level of each module, this of course making it possible to perform separate or non-separate (vertical) frame processing. Horizontal processing may then allow either a black and white video signal processing over the eight input paths, or, advantageously, over the color components of the video image signals, it being possible to process the red and blue components separately with a view to creating either color corrections or special effects. Finally, it is noted that choosing identical coefficients for modules made identical in this way allows parallel processing of the input signals. The corresponding module(s) 2 can then be made either transparent or identical.

Figure 10A:
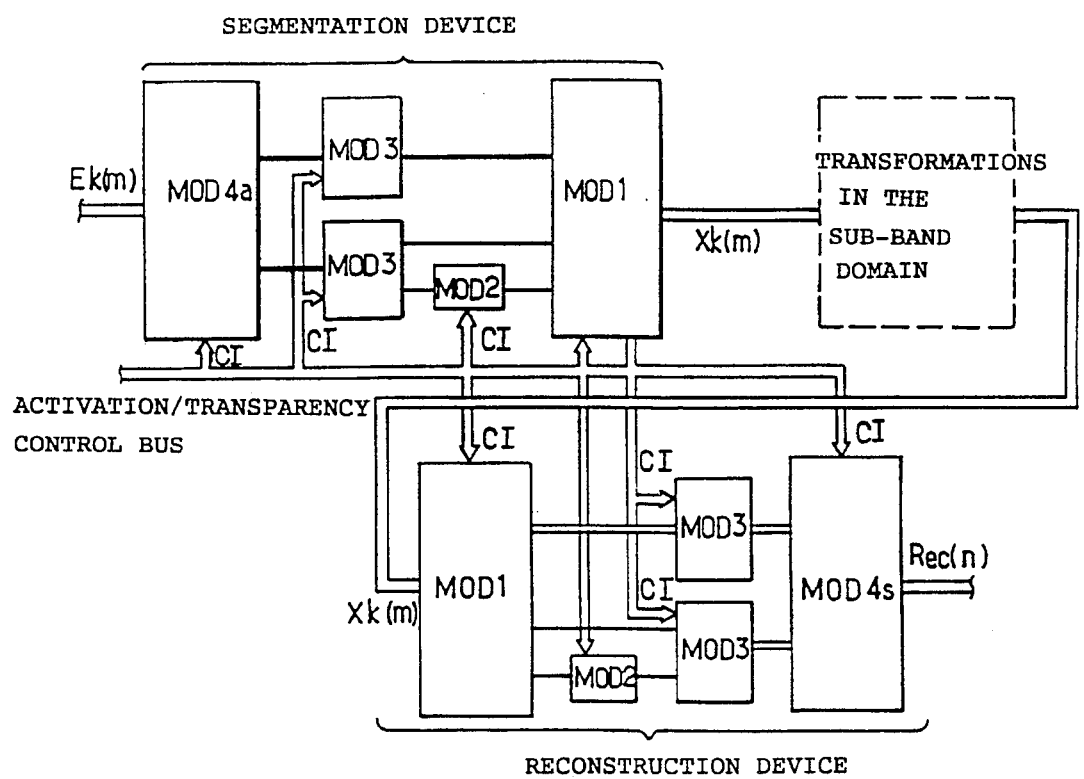
FIGS. 10a, 10b, 10c represent various installation diagrams for the typical modules represented in FIGS. 9a to 9d in order to construct the device for segmentation and/or reconstruction of a digital sub-band signal according to the subject of the invention.
Figure 10B:
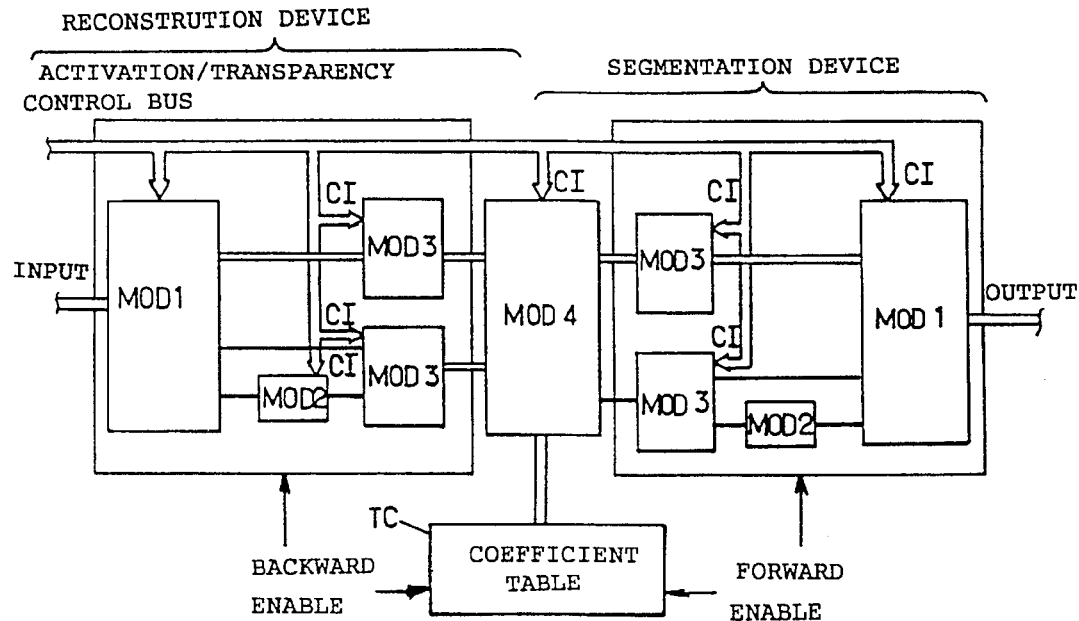
Figure 10C:
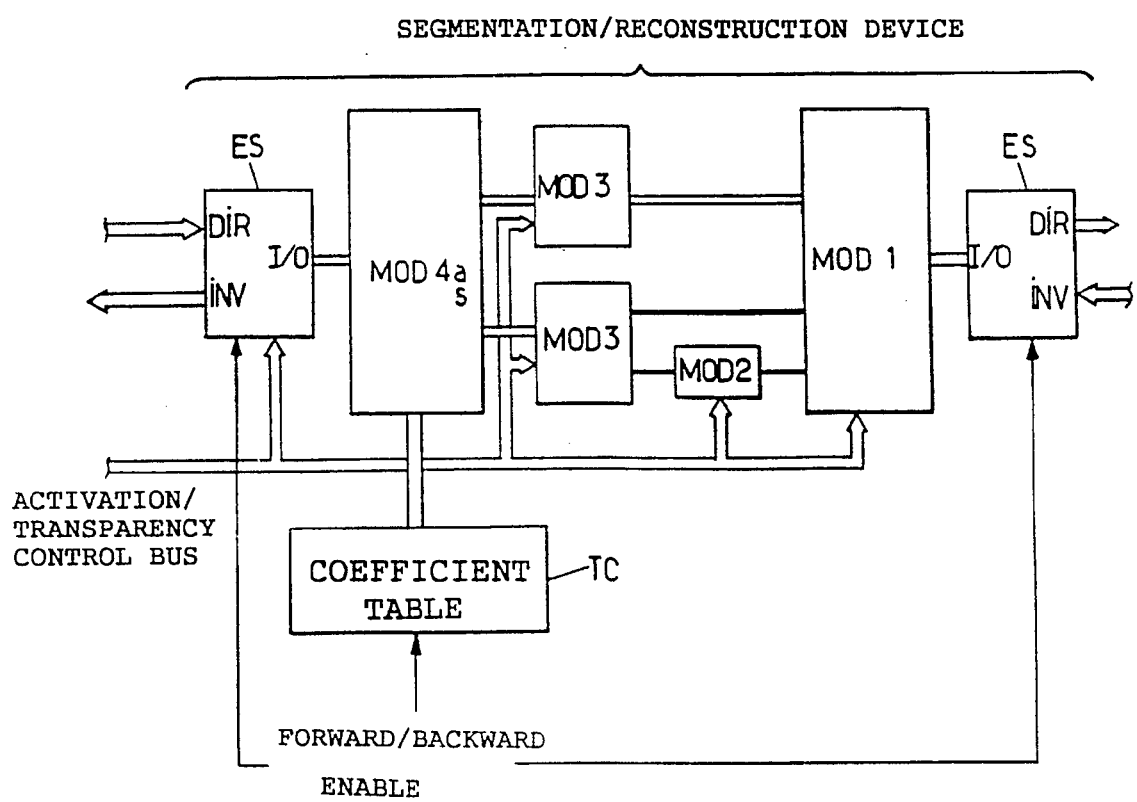

Installation of the various aforesaid modules is represented in FIG. 10a to 10c, the corresponding integrated circuit then making it possible to produce, either a segmentation device in accordance with the subject of the present invention, or a reconstruction device depending on the flow of processed data making up the digital input signal, and of course on the stored coefficient values for the corresponding processing.

FIG. 10a represents an installation diagram in which the segmentation device and the reconstruction device are topographically separated, by an area for processing or for transforming the signals into sub-bands, and which does not form part of the subject of the present invention. The modules 4a and 4s, relating to analysis or segmentation respectively to synthesis or reconstruction, correspond to those described in FIG. 9b or 9c, respectively. In FIG. 10b, the segmentation device and the reconstruction device are again topographically separated but joined together by one and the same Module4, which can integrate, for the simplified single module, to switchable memory blocks, so as to produce, on switching, one or the other of Module 4a, Module4s, represented in FIG. 9b or 9c. A table of coefficients TC allows, on enabling the direct respectively inverse direction, storage of the multiplicative coefficients of the multiplier circuits of the network making up the various installed modules, the unenabled segmentation or reconstruction device being rendered inactive.

Finally, FIG. 10c corresponds to an installation diagram in which the segmentation, respectively reconstruction, devices are topographically coincident. In this case, the input ports for the samples Ek(m) respectively for the sub-band components Xk(m), or vice versa, are each supplemented with an input/output circuit ES of inverting type, controlled by a forward, segmentation, backward, reconstruction, enable signal. It is understood that in the case of FIG. 10c, the single integrated circuit is traversed by a data flow in an opposite direction depending on the type of transformation, segmentation or reconstruction, actually enabled.

In particular, depending on the direction of the envisaged transformation, direct or inverse, Module 4 can be supplied with a table of particular coefficients, defined earlier in the description for segmentation, respectively for reconstruction. Module 4 plays the role either of Module 4a or of Module 4s.

A process and a device for segmentation of a digital signal into sub-bands, respectively for reconstruction of this signal, have thus been described, which are particularly powerful insofar as a sequence of successive processing procedures have made it possible to devise processing procedures and dual processing modules, thus making it possible, based on one and the same integrated circuit in which the corresponding modules are installed, to perform, either segmentation processing, or reconstruction processing in real time, or in shared time.

Furthermore, it is also pointed out that the embodiment described earlier in integrated circuit form implementing a fast processing algorithm can be generalized to MOT filter banks. In this case, the operational cost in additions and subtractions, as well as the sizes of the memories used remain identical to that of the embodiment based on PRMF filter banks, whilst however offering, on the one hand, greater flexibility in the choice of coefficients of the various modules, which are not fixed, and are therefore adjustable, by reason of the additional degree of freedom enjoyed by the filters of the MOT family and, on the other hand, better frequency selectivity. A plurality of elementary lookup tables containing various values or various groups of values of these coefficients can then be used.

We claim:

1. A device for sub-band segmentation of a digital input signal into sub-band signals, $X_k$, where k designates the rank of each of said sub-band signals, said input digital signal comprising a sequence of digital samples E(n) where n designates a current index of said digital samples and said device comprising a plurality SB of parallel paths each receiving said digital samples E(n) where SB designates a given number of said plurality of parallel paths, wherein for a series of sample blocks formed of a same given number SB of digital samples, said device comprises:

prefiltering means for prefiltering the digital input signal, said prefiltering comprising a modified polyphase filtering applied to each sample block and said prefiltering means comprising a low-pass filter, with a symmetric and an antisymmetric component each modulated by a periodic function, for providing digital sub-band filtering of each of said sample blocks so as to produce components of prefiltered signals, and means for processing by inverse frequency transform of dimension SB of said components of prefiltered signals so as to produce said sub-band signal $X_k$.

2. The device as claimed in claim 1, wherein said prefiltering means and means for processing by inverse frequency transform are formed by banks of Modulated Orthogonal Transforms filters having a transfer function for segmentation $$hk(n)=\frac{1}{2} \cdot [hs(n) \cdot Ck(n) - ha(n) \cdot Ck(NF-1-n)]$$

where hs(n) and ha(n) represent respectively the transfer functions of symmetric and asymmetric components, with respect to the midpoint of the filters, of the transfer function h(n) of the prototype filter, Ck(n) and Ck(NF-1-n) representing periodic modulation functions, said periodic modulation functions being formed by modules having a transfer function:

$$Ck(n) = 2 \cdot \cos\left[\frac{\pi \cdot (2k+1) \cdot (2n - NF + 1 - SB)}{4 \cdot SB}\right]$$

for the segmentation device, transfer functions in which:

n represent the current index, k represents the rank of the relevant sub-band,

NF represents the number of coefficients of the filter bank used,

SB represents the number of sub-bands within which segmentation is performed by said device, h(n) represents the impulse response of the prototype filter, and hs(n) represents the impulse response of the symmetric component of h(n).

3. The device as claimed in claim 2, wherein said means for prefiltering and for processing by inverse frequency transform are formed by Perfect Reconstruction Modulated filter banks having a transfer function for segmentation h(n)·Ck(n), where h(n) represents the transfer function of the prototype filter, h(n)=hs(n) the asymmetric component ha(n) being chosen zero, ha(n)=0, said periodic modulation function being formed by modules having a transfer function $$Ck(n) = 2 \cdot \cos\left[\frac{\pi \cdot (2k+1) \cdot (2n - NF + 1 - SB)}{4 \cdot SB}\right] \quad (3)$$

for the segmentation device.

4. The device as claimed in claim 3, wherein for a PRMF filter bank adapted for throughput reduction coding, including a number of coefficients NF≤2·SB, said filter bank consists either of an odd number NF of coefficients of the filter, NF=2·SB−1, the transfer function of said prototype filter satisfying the relation:

$$h(n) = \frac{1}{\sqrt{2 \cdot SB}} \cdot \sin\frac{(n+1) \cdot \pi}{2 \cdot SB},$$

with $n \in [0, 2 \cdot SB - 2]$ or by an even number NF of coefficients of the filter NF=2·SB, the transfer function of said prototype filter satisfying the relation:

$$h(n) = \frac{1}{\sqrt{2 \cdot SB}} \cdot \sin\frac{(n+0.5) \cdot \pi}{2 \cdot SB},$$

with $n \in [0, 2 \cdot SB - 1]$.

5. The device as claimed in claim 4, wherein said means for prefiltering the digital input signal are formed, for an even respectively odd number NF of coefficients of the filter, by a trellis module whose transfer function satisfies the relation:

$$S_i(m) = a_i \cdot E_i(i\ m-1) - b_i \cdot E_{SB-i-2\theta}(m-1)$$

$$S_{SB-i-2\theta}(m) = a_i \cdot E_{SB-i-2\theta}(m)$$

for i rank of the sample $E_i$ in a sample block of size SB, such that $$i \in \left[0, \frac{SB}{2} - 1\right]$$

for NF even, respectively $$i \in \left[1, \frac{SB}{2} - 1\right]$$

for NF odd, with θ=0 for NF odd, and θ=0.5 for NF even, said trellis module moreover satisfying the relation:

$$S_o(m) = a_o \cdot E_o(m-1)$$

for i=0, and $$S_{SB/2}(m) = b_{SB/2} \cdot E_{SB/2}(m)$$

for $$i = \frac{SB}{2}$$

for NF odd, relations in which $a_i$, $b_i$ are specified numerical values assigned to the rank i and related to the coefficients h(n) of each sample, m denoting the index of the current block of width SB.

6. The device as claimed in claim 5, wherein said means for processing by inverse frequency transform contain rotation modules, in the first and last stage, respectively, mounted in cascade with an input submodule of the frequency transform, said rotation modules having a transfer function satisfying the relation:

$$e_i(m) = c_i \cdot S_i(m) - d_i \cdot S_{SB-i-2\theta}(m)$$

$$f_i(m) = c_i \cdot S_{SB-i-2\theta t}(m) + d_i \cdot S_i(m),$$

said trellis modules respectively, prefiltering modules and rotation modules forming an input module for the frequency transform being mounted in cascade.

7. The device as claimed in claim 6, wherein said rotation modules and trellis modules in cascade are replaced by a single module, said single module including a trellis sub-module whose transfer function satisfies the relation:

$$E_{t1}(m) = [(a_i c_i - b_i d_i) E_i(m) - (a_i d_i + b_i c_i) E_{SB-i-2\theta}(m)]$$

$$F_{t1}(m) = [(a_i d_i - b_i c_i) E_i(m) - (a_i c_i + b_i d_i) E_{SB-i-2\theta}(m)],$$

a trellis sub-module in parallel with said direct trellis sub-module, whose transfer function satisfies the relation:

$$E_{i2}(m)=[V_i(m)-V_i(m+1)](\alpha \cdot c_i)$$

$$F_{i2}(m)=[V_i(m)-V_i(m+1)](\alpha \cdot d_i)$$

with $$V_i(m+1) = \frac{a_i}{\alpha} \cdot E_i(m) - \frac{b_i}{\alpha} \cdot E_{SB-i-20}(m)$$

the resulting signal delivered by the single module being of the form $$e_i(m)=E_{i1}(m)+E_{i2}(m), f_i(m)=Fil(m)+F_{i2}(m),$$

relations in which $\alpha$ is a specified value for each $$i \in \left[ 0, \frac{SB}{2} - 1 \right]$$

for NF even and $$i \in \left[ 1, \frac{SB}{2} - 1 \right]$$

for NF odd, the single module being reduced for NF odd and i=0 and $$i = \frac{SB}{2}$$

to a simplified module satisfying the relation:

$$e_o(m)=a_0 \cdot c_0 \cdot E_0(m-1)+b_0 \cdot c_0 \cdot E_{SB/2}(m)$$

$$f_o(m)=a_0 \cdot c_0 \cdot E_0(m-1)+b_0 \cdot c_0 \cdot E_{SB/2}(m).$$

8. The device as claimed in claim 7, wherein for optimal normalization, the expressions $a_i \cdot c_i - b_i \cdot d_i$ and $a_i \cdot d_i + b_i \cdot c_i$ are taken equal to ½ or –½.

9. The device as claimed in claim 7, wherein said single modules are arranged in parallel so as to constitute a stage for prefiltering all of the samples each stage including for an odd number of filter coefficients a simplified single module, a plurality of $$\frac{SB}{2} - 1$$

single modules, each stage for prefiltering thus formed being followed by an even FFT type frequency transform stage.

10. The device as claimed in claim 9, wherein said device comprises an integrated circuit including:

at least one butterfly module of size SB, at least one butterfly module of size SB/2, at least one elementary rotation module providing interconnection of said at least one butterfly module of size SB and of at least one of the butterfly modules of size SB/2, a plurality of single modules including at least one simplified single module providing said prefiltering of the samples of the digital input signal.

11. The device as claimed in claim 10, wherein for SB=8 and NF=15 and in an application for segmentation of digital image signals, said integrated circuit comprises:

a butterfly module of size eight, an elementary rotation module, two butterfly modules of size four, one of said butterfly modules of size four being interconnected to said butterfly module of size eight by way of said elementary rotation module, a plurality of single modules formed by a simplified single module and three single modules, said single modules being interconnected with said butterfly modules of size four.

12. The device as claimed in claim 11, further comprising a lookup table for the values of the coefficients of said modules, thus allowing the use of said integrated circuit, depending on the enabling of the values of said coefficients for segmentation.

13. The device as claimed in claim 12, wherein the values of said coefficients are adjustable, and said lookup table comprises of a plurality of elementary lookup tables.

14. The device as claimed in claim 10, wherein each module comprises an input for control of activation/transparency of the corresponding module, each module allowing, upon command for setting to transparency, identical transmission from the inputs of said module to its outputs.

15. The device as claimed in claim 7, wherein said single modules are arranged in parallel so as to constitute a stage for prefiltering all of the samples each stage including for an even number of filter coefficients:

a plurality of $$\frac{SB}{2}$$

single modules, each stage for prefiltering thus formed being followed by an odd FFT type frequency transform stage.

16. The device as claimed in claim 3, wherein said prototype filter includes an odd number of coefficients, said prototype filter being subdivided by a first subdivision, of rank q, (q=1), into first and second elementary filters, the first elementary filter including an even number of coefficients and the second elementary filter including an odd number of coefficients, each second elementary filter of rank q being able in turn to be subdivided by successive subdivision of higher rank q+1 into a first and into a second elementary filter of corresponding rank q+1 comprising respectively an even and odd number of coefficients, each first respectively second elementary filter of rank q being intended for processing $SB/2^q$ sub-bands, where SB denotes the number of sub-bands.

17. A device for reconstruction of a digital sub-band signal to a reconstructed digital signal, said digital sub-band signal corresponding to a plurality of a given number SB of sub-band signals $X_k$, k $\theta$ {0, SB-1} delivered in parallel, where k designates the rank of each of said sub-band signals, following a segmentation into sub-bands of a digital signal E(n) on a plurality SB of parallel paths, wherein, for a plurality of SB sub-band signals, said device comprises:

means for processing said sub-band signals by direct frequency transform so as to produce a plurality of transformed digital signals, and postfiltering means for postfiltering said transformed digital signals, said postfiltering comprising a modified polyphase filtering and said postfiltering means comprising a low-pass filter, with a symmetric component and an antisymmetric component each modulated by a periodic function, for providing said modified polyphase filtering to thereby enable said reconstructed digital signals to be produced.

18. The device as claimed in claim 17, wherein said means for processing by direct frequency transform and means for postfiltering are formed by banks of Modulated Orthogonal Transforms filters having a transfer function for reconstruction $$gk(n) = \frac{1}{2}[hs(n) \cdot Ck(NF-1-n) + ha(n) \cdot Ck(n)]$$

where hs(n) and ha(n) represent respectively the transfer functions of symmetric and asymmetric components, with respect to the midpoint of the filters, of the transfer function h(n) of the prototype filter, Ck(n) and Ck(NF−1−n) representing periodic modulation functions, said periodic modulation functions being formed by modules having a transfer function:

$$Ck(n) = 2 \cdot \cos\left[\frac{\pi \cdot (2k+1) \cdot (2n - NF + 1 - SB)}{4 \cdot SB}\right]$$

for the reconstruction device, transfer functions in which:
n represent the current index,
k represents the rank of the relevant sub-band,
NF represents the number of coefficients of the filter bank used,
SB represents the number of sub-bands within which the reconstruction procedure is performed by said device,
h(n) represents the impulse response of the prototype filter,
hs(n) represents the impulse response of the symmetric component of h(n), and
ha(n) represents the impulse response of asymmetric component of h(n).

19. The device as claimed in claim 18, wherein said means for processing by direct frequency transform and means for postfiltering are formed by perfect Reconstruction Modulated filter banks having a transfer function for reconstruction h(n)·Dk(n), where h(n) represents the transfer function of the prototype filter, h(n)—hs(n) the asymmetric component ha(n) being chosen zero, ha(n)=0, said periodic modulation function being formed by modules having a transfer function $$Ck(NF - 1 - n) = DK(n) = 2 \cdot \cos\left[\frac{\pi \cdot (2k+1) \cdot (2n - NF + 1 - SB)}{4 \cdot SB}\right].$$

20. A method for sub-band segmentation of a digital signal comprising a sequence of digital samples wherein each sample is subjected to parallel processing on a plurality of paths so as to split up said digital signal into a corresponding number SB of sub-bands, said parallel processing for each sub-band being performed by digital sub-band filtering, with a sub-sampling by the corresponding number of sub-bands, so as to produce a sub-band signal $X_k$ for each path, where k designates the rank of each sub-band signal and path, said parallel processing comprising:

forming a sequence of successive sample blocks with a corresponding number SB of samples constituting said digital signal and;

submitting said sequence of successive sample blocks with said corresponding number SB of samples constituting said digital signal to said digital sub-band filtering, said digital sub-band filtering comprising a combination of two steps comprising:

a filtering step comprising low-pass filtering with a symmetric component and an antisymmetric component each modulated by a periodic function, so that said filtering step thus comprises prefiltering said digital signal by a polyphase filtering applied to each of said sample blocks so as to deliver a prefiltered signal; and a processing step comprising an inverse frequency transform of said prefiltered signal to thereby produce a corresponding sub-band signal $X_k$ for each path of corresponding rank k.

21. The process as claimed in claim 20, further comprising submitting at least one of the sub-band signals $X_k$ delivered to the parallel processing on a plurality of paths, so as to split up said sub-band signal $X_k$ into elementary sub-band signals $X_{kl}$, with 1 θ {0,SBE}, SBE denoting the number of elementary sub-bands, and reapplying said parallel processing to at least one of the elementary sub-bands to generate elementary sub-bands of corresponding higher successive rank.

22. A method for sub-band segmentation of a digital signal comprising a sequence of digital samples wherein each sample is subjected to parallel processing on a plurality of paths so as to split up said digital signal into a corresponding number SB of sub-bands, said parallel processing for each sub-band being performed by digital sub-band filtering with a sub-sampling by the corresponding number of sub-bands, so as to produce a sub-band signal $X_k$ for each path, where k designates the rank of each sub-band signal and path, said parallel processing comprising:

forming a sequence of successive sample blocks with a corresponding number SB of samples constituting said digital signal and;

submitting said sequence of successive sample blocks with said corresponding number SB of samples constituting said digital signal to said digital sub-band filtering, said digital sub-band filtering comprising a combination of two steps comprising:

a processing step comprising direct frequency transform of said sequence of successive sample blocks so as to obtain a transformed digital signal, and a filtering step comprising low-pass type filtering with a symmetric component and an antisymmetric component each modulated by a periodical function, so that said filtering step thus comprises postfiltering said transformed signal by a polyphase filtering applied to said transformed digital signal to thereby produce a corresponding sub-band signal $X_k$ for each path of corresponding rank k.

23. The process as claimed in claim 22, further comprising submitting at least one of the sub-band signals $X_k$ delivered to the parallel processing on a plurality of paths, so as to split up said sub-band signal $X_k$ into elementary sub-band signals $X_{kl}$, with 1 θ {0,SBE}, SBE denoting the number of elementary sub-bands, and reapplying said parallel processing to at least one of the elementary sub-bands to generate elementary sub-bands of corresponding higher successive rank.

24. A method for the reconstruction of a reconstructed digital signal Rec(n), where n designates the current index of a given sample constituting said reconstructed digital signal, from a given number SB of sub-bank signals $X_k$ which are delivered in parallel following a segmentation into sub-bands of an input signal E(n), where k designates the rank of each sub-band signal, said method for reconstruction comprising parallel processing each sub-band signal $X_k$ through oversampling by said given number SB of sub-band signals and digital filtering so as to produce corresponding reconstructed digital signal sub-band components of same rank and synchronously summing said reconstructed digital sub-band components so as to generate said reconstructed digital signal, said method for reconstruction comprising, for said given number SB of sub-band signals $X_k$, performing, in combination, a filtering and a frequency transform of said sub-band signals, said combination of filtering and frequency transform being performed using a low-pass prototype filtering with two components each modulated by a periodic function, said filtering corresponding to a modified polyphase prefiltering, said frequency transform comprising processing each digital sub-band signal $X_k$ by direct frequency transform, so as to produce a plurality of transformed digital sub-band signals, and said filtering comprising postfiltering said transformed digital sub-band signals, so as to produce postfiltered transformed digital signals, to thereby produce said reconstructed digital signal.

25. The process as claimed in claim 24, wherein for a plurality of sub-band signals, one at least of which is in the form of at least one elementary sub-band of specified rank p, said process comprises submitting said elementary sub-band signal of relevant rank to the reconstruction process in order to generate by reconstruction an elementary sub-band signal of lower rank, in succession, and then the corresponding sub-band signal $X_k$.

26. A method for the reconstruction of a reconstructed digital signal Rec(n), where n designates the current index of a given sample constituting said reconstructed digital signal, from a given number SB of sub-band signals $X_k$ which are delivered in parallel following a segmentation into sub-bands of an input signal E(n), where k designates the rank of each sub-band signal, said method for reconstruction comprising parallel processing each sub-band signal $X_k$ through oversampling by said given number SB of sub-band signals and digital filtering so as to produce corresponding reconstructed digital sub-band components of same rank and synchronously summing said reconstructed digital sub-bands components so as to generate said reconstructed signal, said method for reconstruction comprising, for said given number SB of sub-band signals $X_k$, performing, in combination, a filtering and a frequency transform of said sub-band signals, said combination of filtering and frequency transform being performed using a low-pass prototype filtering with two components each modulated by a period polyphase filtering, said filtering comprising prefiltering each digital sub-band signal $X_k$ so as to produce a plurality of prefiltered digital sub-band signals, and said frequency transform comprising processing said prefiltered digital sub-band signals by inverse frequency transform so as to produce transformed digital signals, to thereby produce said reconstructed digital signal.

27. The method as claimed in claim 26, wherein for a plurality of sub-band signals, one at least of which is in the form of at least one elementary sub-band of given rank p, said method comprises submitting said elementary sub-band signal of relevant rank to the reconstruction process in order to generate by reconstruction an elementary sub-band signal of lower rank, in succession, and then the corresponding sub-band signal $X_k$.

* * * * *